(12) United States Patent
Koyama et al.

(10) Patent No.: US 6,795,463 B2
(45) Date of Patent: Sep. 21, 2004

(54) LIGHT-EMITTING DEVICE

(75) Inventors: Tomoko Koyama, Suwa (JP); Takeo Kaneko, Misato-mura (JP)

(73) Assignee: Seiko Epson Corporation, Tokyo (JP)

( * ) Notice: Subject to any disclaimer, the term of this patent is extended or adjusted under 35 U.S.C. 154(b) by 493 days.

(21) Appl. No.: 09/795,435

(22) Filed: Mar. 1, 2001

(65) Prior Publication Data

US 2001/0043627 A1 Nov. 22, 2001

(30) Foreign Application Priority Data

Mar. 1, 2000 (JP) ........................................ 2000-055491

(51) Int. Cl.[7] ................................................ H01S 3/14
(52) U.S. Cl. ............................ 372/39; 372/43; 372/45; 372/46
(58) Field of Search ............................ 372/34, 45, 46, 372/43

(56) References Cited

U.S. PATENT DOCUMENTS

| | | | | |
|---|---|---|---|---|
| 4,884,112 A | * | 11/1989 | Lorenzo et al. | ............... 257/86 |
| 5,548,137 A | * | 8/1996 | Fan et al. | ................... 257/191 |
| 5,920,086 A | * | 7/1999 | MacFarlane et al. | ........ 257/103 |
| 6,462,356 B1 | * | 10/2002 | Koyama et al. | ............... 257/79 |

FOREIGN PATENT DOCUMENTS

JP        63-70257 A      3/1988

(List continued on next page.)

OTHER PUBLICATIONS

U.S. patent application Ser. No. 09/531,330, Koyama et al., filed Mar. 20, 2000.
U.S. patent application Ser. No. 09/920,755, Koyama et al., filed Aug. 3, 2001.
U.S. patent application Ser. No. 09/762,614, Koyama et al., filed Feb. 9, 2001.
U.S. patent application Ser. No. 09/869,157, Koyama et al., filed Jun. 25, 2001.
U.S. patent application Ser. No. 09/878,994, Koyama et al., filed Jun. 13, 2001.

*Primary Examiner*—David Vu
*Assistant Examiner*—Dung T Nguyen
(74) *Attorney, Agent, or Firm*—Oliff & Berridge, PLC

(57) ABSTRACT

A light-emitting device includes a substrate and a light-emitting device section. The light-emitting device section includes a light-emitting layer capable of emitting light by electroluminescence, a pair of electrode layers for applying an electric field to the light-emitting layer, an optical section for propagating light generated in the light-emitting layer in a specific direction, and an insulation layer disposed between the pair of electrode layers, having an opening formed in part thereof and can function as a current concentrating layer for specifying a region through which current to be supplied to the light-emitting layer flows via a layer in the opening. The optical section has a defect section which forms photonic bandgaps capable of inhibiting a three-dimensional spontaneous emission, and the energy level of the defect section, caused by the defect, is set to be within a specific emission spectrum. Light generated in the light-emitting layer is emitted with a three-dimensional spontaneous emission being inhibited by the photonic bandgaps.

34 Claims, 23 Drawing Sheets

FOREIGN PATENT DOCUMENTS

| | | |
|---|---|---|
| JP | 63-175860 A | 7/1988 |
| JP | 1-221741 A | 9/1989 |
| JP | 2-51101 A | 2/1990 |
| JP | 2-135359 A | 5/1990 |
| JP | 2-135361 A | 5/1990 |
| JP | 3-152184 A | 6/1991 |
| JP | 5-39480 A | 2/1993 |
| JP | 5-273427 A | 10/1993 |
| JP | 5-297202 A | 11/1993 |
| JP | 6-201907 A | 7/1994 |
| JP | 6-224115 A | 8/1994 |
| JP | 7-20637 A | 1/1995 |
| JP | 7-181689 A | 7/1995 |
| JP | 7-235075 A | 9/1995 |
| JP | 8-15506 A | 1/1996 |
| JP | 8-248276 A | 9/1996 |
| JP | 9-178901 A | 7/1997 |
| JP | 9-211728 A | 8/1997 |
| JP | 9-311238 A | 12/1997 |
| JP | 10-8300 A | 1/1998 |
| JP | 10-26702 A | 1/1998 |
| JP | 10-59743 A | 3/1998 |
| JP | 10-153967 A | 6/1998 |
| JP | 2000-35504 A | 2/2000 |

* cited by examiner

A-A

B-B

C-C

LIGHT-EMITTING DEVICE

BACKGROUND OF THE INVENTION

1. Field of the Invention

The present invention relates to a light-emitting device using electroluminescence (EL).

2. Description of the Related Art

Semiconductor lasers have been used as a light source for optical communications systems. Semiconductor lasers excel in wavelength selectivity and can emit light with a single mode. However, it is difficult to fabricate the semiconductor lasers because many stages of crystal growth are required. Moreover, types of light-emitting materials used for semiconductor lasers are limited. Therefore, semiconductor lasers cannot emit light with various wavelengths.

Conventional EL light-emitting devices which emit light with a broad spectral width have been used in some application such as for displays. However, EL light-emitting devices are unsuitable for optical communications and the like, in which light with a narrow spectral width is required.

SUMMARY OF THE INVENTION

An object of the present invention is to provide a light-emitting device which can emit light with a remarkably narrow spectral width in comparison with conventional EL light-emitting devices, and can be applied not only to displays but also to optical communications and the like.

Light-emitting Device of First Embodiment

A light-emitting device according to a first embodiment of the present invention comprises a substrate and a light-emitting device section, wherein the light-emitting device section includes:
  a light-emitting layer capable of emitting light by electroluminescence;
  a pair of electrode layers for applying an electric field to the light-emitting layer;
  an optical section for propagating light emitted in the light-emitting layer in a specific direction; and
  an insulation layer disposed between the pair of electrode layers, having an opening formed in part of the insulation layer and capable of functioning as a current concentrating layer for specifying a region through which current supplied to the light-emitting layer flows through a layer in the opening, wherein the optical section forms photonic bandgaps capable of inhibiting three dimensional spontaneous emission of light and includes a defect section which is set so that an energy level caused by a defect is within a specific emission spectrum, and wherein the light emitted in the light-emitting layer is emitted with spontaneous emission being inhibited in three dimensions by the photonic bandgaps.

According to this light-emitting device, electrons and holes are injected into the light-emitting layer respectively from the pair of electrode layers (cathode and anode). Light is emitted when the molecules return to the ground state from the excited state by allowing the electrons and holes to recombine in the light-emitting layer. At this time, light with a wavelength in the photonic bandgaps cannot be propagated through the optical section. Only light with a wavelength equivalent to the energy level caused by the defect is propagated through the optical section. Therefore, light with a narrow emission spectrum width with an inhibited three-dimensional spontaneous emission can be obtained with high efficiency by specifying the width of the energy level caused by the defect.

According to the first light-emitting device, since the insulation layer functions as a current concentrating layer in the light-emitting device section, the region through which current supplied to the light-emitting layer flows can be specified. Therefore, current intensity and current distribution can be controlled in the region from which light is to emit, whereby light can be emitted with high emission efficiency.

In the case where the insulation layer functions as cladding, assuming that the waveguide formed of a light-emitting layer as a core and an insulation layer as cladding, the guide mode of light propagated toward the waveguide section through the optical section can be controlled by specifying the opening of the insulation layer. Specifically, the guide mode of light propagated through the light-emitting layer (core) can be set at a specific value by specifying the width of the region in which light is confined (width perpendicular to the direction in which light is propagated) by the insulation layer (cladding) The relation between the guide mode and the waveguide is generally represented by the following equation.

$$N\max + 1 \geq K_0 \cdot a \cdot (n_1^2 - n_2^2)^{1/2}/(\pi/2)$$

where:
$K_0$: $2\pi/\lambda$,
a: half width of waveguide core,
$n_1$: refractive index of waveguide core,
$n_2$: refractive index of waveguide cladding, and
Nmax: maximum value of possible guide mode.

Therefore, if the parameters of the above equation such as the refractive indices of the core and cladding have been specified, the width of the light-emitting layer (core) specified by the width of the opening of the current concentrating layer may be selected depending on the desired guide mode. Specifically, the width (2a) of the light-emitting layer corresponding to the core in a desired guide mode can be calculated from the above equation by substituting the refractive indices of the light-emitting layer provided inside the current concentrating layer and the insulation layer (current concentrating layer) for the refractive indices of the core and cladding of the waveguide, respectively. The suitable width of the core layer of the waveguide section to which light is supplied from the light-emitting device section can be determined taking into consideration the resulting width of the light-emitting layer, calculated value obtained from the above equation based on the desired guide mode, and the like. Light with a desired mode can be propagated from the light-emitting device section toward the waveguide section with high combination efficiency by appropriately specifying the width of the light-emitting layer, width of the core layer, and the like. In the light-emitting device section, light-emitting layer in the current concentrating layer formed of the insulation layer may not uniformly emit light. Therefore, the specific values for each member such as the light-emitting layer, optical section, and waveguide section can be suitably adjusted based on the width (2a) of the core (light-emitting layer), determined using the above equation, so that each member exhibits high combination efficiency.

The guide mode of the light-emitting device can be set to 0 to 1000. In particular, when used for communications, the guide mode can be set to about 0 to 10. Light with a specific guide mode can be efficiently obtained by specifying the guide mode of light in the light-emitting layer in this manner.

As described above, according to the present invention, a light-emitting device which substantially has three-dimensional photonic bandgaps structure can emit light with a remarkably narrow spectral width in comparison with conventional EL light-emitting devices and exhibiting directivity, and can be applied not only to displays but also optical communications and the like, can be provided.

Light-emitting Device of Second Embodiment

A light-emitting device according to a second embodiment of the present invention comprises comprising a light-emitting device section and a waveguide section propagating light from the light-emitting device section which are integrally formed on a substrate, wherein the light-emitting device section includes:
   a light-emitting layer capable of emitting light by electroluminescence;
   a pair of electrode layers for applying an electric field to the light-emitting layer;
   an optical section for propagating light emitted in the light-emitting layer in a specific direction; and
   an insulation layer disposed between the pair of electrode layers and capable of functioning as a cladding layer, wherein the waveguide section includes:
   a core layer continuously formed with part of the optical section; and
   a cladding layer continuously formed with the insulation layer, and wherein the optical section forms photonic bandgaps capable of inhibiting three dimensional spontaneous emission of light and includes a defect section which is set so that an energy level caused by a defect is within a specific emission spectrum, and wherein the light emitted in the light-emitting layer is emitted with spontaneous emission being inhibited in three dimensions by the photonic bandgaps.

According to the second light-emitting device, at least part of the optical section in the light-emitting device section and the core layer in the waveguide section are integrally formed, and the insulation layer (cladding layer) in the light-emitting device section and the cladding layer in the waveguide section are integrally formed. Therefore, the light-emitting device section and the waveguide section are optically connected with high combination efficiency, thereby ensuring efficient light propagation.

In this configuration, as the material for the insulation layer, a material which functions as a cladding layer for light with a specific wavelength is selected. According to this light-emitting device, since at least part of the optical section in the light-emitting device section and the core layer in the waveguide section can be formed and patterned in the same step, fabrication can be simplified. The insulation layer (cladding layer) in the light-emitting device section and the cladding layer in the waveguide section can be formed and patterned in the same step. This also simplifies the fabrication.

According to the present invention, a light-emitting device, which substantially has a three-dimensional photonic band gap structure, can emit light having a remarkably narrower spectral width than conventional EL light-emitting devices and exhibiting directivity, and can be applied not only to displays but also to optical communications and the like can be provided in the same manner as in the first light-emitting device.

In the light-emitting device of the first or second embodiment, the opening formed in the insulation layer and functioning as a current concentrating layer or a cladding layer may be formed so as to face the optical section. The opening may be a slit extending in the periodic direction of the first optical section, specifically, in the direction in which light is waveguided. It is appropriate that at least part of the light-emitting layer be present in the opening formed in the insulation layer. According to this configuration, the region of the light-emitting layer to which current is to supplied and the region specified by the current concentrating layer can be self-alignably positioned.

The light-emitting device according to the present invention may have the following structure.

In the light-emitting device, the optical section may comprise:
   a first optical section having a periodic refractive index distribution in at least two directions on XY surface and capable of forming two-dimensional photonic bandgaps; and
   a second optical section having a periodic refractive index distribution in at least Z direction and capable of forming at least one-dimensional photonic bandgaps, and
   the defect section may be formed in the first optical section, and light may be emitted in one direction on the XY surface of the first optical section.

According to this light-emitting device, light with a very narrow emission spectrum width with a three-dimensional spontaneous emission being inhibited can be obtained with high efficiency by the combination of the first optical section which inhibits a two-dimensional light propagation at the X-Y surface and the second optical section which inhibits a one-dimensional light propagation at least in the Z direction.

The second optical section may have a structure such as a grating-shaped structure, a multilayer film structure, a columnar or mosaic columnar-shaped structure, or a combination of these structures.

Specifically, the second optical section includes first medium layers and second medium layers alternately arranged. Therefore, the second optical section has a periodic refractive index distribution in the Z direction, thereby forming one-dimensional photonic bandgaps. The second optical section may have a periodic refractive index distribution in each of the x, Y, and Z directions in which the first medium layers and the second medium layers are alternately arranged, thereby forming a three-dimensional photonic band. The second optical section may include a plurality of unit cells of the diamond structure and form three-dimensional photonic bandgaps.

Specifically, the first optical section may include columnar-shaped first medium layers arranged in the shape of tetragonal lattice and second medium layers formed between the first medium layers, and have a periodic refractive index distribution in the first and second directions. Photonic bandgaps with inhibited spontaneous emission in the two directions at the XY surface can be formed by this first optical section.

The first optical section may include columnar-shaped first medium layers arranged in the shape of a triangle lattice or a honeycomb lattice, for example, and second medium layers formed between the first medium layers, and have a periodic refractive index distribution in the first, second, and third directions at the XY surface. Photonic bandgaps with inhibited spontaneous emission in the three directions at the X-Y surface can be formed by this first optical section.

The light-emitting layer may include an organic light-emitting material as the light-emitting material. Use of the organic light-emitting material widens selection of materials and enables emission of light with various wavelengths in comparison with the case of using a semiconductor material or inorganic material, for example.

Some of the materials which can be used for each section of the light-emitting device according to the present invention are illustrated below. These materials are only some of the conventional materials. Materials other than these materials may also be used.

Light-Emitting Layer

The material for the light-emitting layer is selected from conventional compounds in order to obtain light with a specific wavelength. As the material for the light-emitting layer, any organic or inorganic compound may be used. Of these, organic compounds are suitable in view of availability of a wide variety of compounds and film-formability.

As examples of such organic compounds, aromatic diamine derivatives (TBD), oxydiazole derivatives (PBD), oxydiazole dimers (OXD-8), distyrylarylene derivatives (DSA), beryllium-benzoquinolinol complex (Bebq), triphenylamine derivatives (MTDATA), rubrene, quinacridone, triazole derivatives, polyphenylene, polyalkylfluorene, polyalkylthiophene, azomethine zinc complex, polyphyrin zinc complex, benzooxazole zinc complex, and phenanthroline europium complex which are disclosed in Japanese Patent Application Laid-open No. 10-153967, and the like can be given.

As the material for the organic light-emitting layer, conventional materials disclosed in Japanese Patent Application Laid-open No. 63-70257, No. 63-175860, No. 2-135361, No. 2-135359, No. 3-152184, No. 8-248276, No. 10-153967, and the like can be used. These compounds may be used either individually or in combination of two or more.

As examples of inorganic compounds, ZnS:Mn (red region), ZnS:TbOF (green region), SrS:Cu, SrS:Ag, SrS:Ce (blue region), and the like can be given.

Optical Waveguide

The optical waveguide includes a layer which functions as a core, and a layer which has a refractive index lower than that of the core and functions as cladding. Specifically, these layers include the optical section (core) and the insulation layer (cladding) in the light-emitting device section, the core layer and the cladding layer in the waveguide section, substrate (cladding), and the like. Conventional inorganic and organic materials may be used for the layers for forming the optical waveguide.

Typical examples of inorganic materials include $TiO_2$, $TiO_2$–$SiO_2$ mixture, ZnO, $Nb_2O_5$, $Si_3N_4$, $Ta_2O_5$, $HfO_2$, and $ZrO_2$ disclosed in Japanese Patent Application Laid-open No. 5-273427.

As typical examples of organic materials, various conventional resins such as thermoplastic resins, thermosetting resins, and photocurable resins can be given. These resins are appropriately selected depending on the method of forming the layer and the like. For example, use of a resin cured by energy of at least one of heat or light enables utilization of commonly used exposure devices, baking ovens, hot plates, and the like.

As examples of such materials, a UV-curable resin disclosed in Japanese Patent Application No. 10-279439 by the applicant of the present invention can be given. As UV-curable resins, acrylic resins are suitable. UV-curable acrylic resins having excellent transparency and capable of curing in a short period of time can be obtained by using commercially-available resins and photosensitizers.

As specific examples of basic components of such UV-curable acrylic resins, prepolymers, oligomers, and monomers can be given.

Examples of prepolymers or oligomers include acrylates such as epoxy acrylates, urethane acrylates, polyester acrylates, polyether acrylates, and spiroacetal-type acrylates, methacrylates such as epoxy methacrylates, urethane methacrylates, polyester methacrylates, and polyether methacrylates, and the like.

Examples of monomers include monofunctional monomers such as 2-ethylhexyl acrylate, 2-ethylhexyl methacrylate, 2-hydroxyethyl acrylate, 2-hydroxyethyl methacrylate, N-vinyl-2-pyrrolidone, carbitol acrylate, tetrahydrofurfuryl acrylate, isobornyl acrylate, dicyclopentenyl acrylate, and 1,3-butanediol acrylate, bifunctional monomers such as 1,6-hexanediol diacrylate, 1,6-hexanediol dimethacrylate, neopentyl glycol diacrylate, neopentyl glycol dimethacrylate, ethylene glycol diacrylate, polyethylene glycol diacrylate, and pentaerythritol diacrylate, and polyfunctional monomers such as trimethylolpropane triacrylate, trimethylolpropane trimethacrylate, pentaerythritol triacrylate, and dipentaerythritol hexaacrylate.

These inorganic and organic materials are illustrated taking only light confinement into consideration. In the case where the light-emitting device section has a light-emitting layer, hole transport layer, electron transport layer, and electrode layer, and at least one of these layers functions as the core or cladding layer, the materials for these layers may be employed as the material for the layers of the optical waveguide.

Hole Transport Layer

In the case of using an organic light-emitting layer in the light-emitting device section, a hole transport layer may be formed between the electrode layer (anode) and the organic light-emitting layer, as required. As the materials for the hole transport layer, materials conventionally used as hole injection materials for photoconductive materials or materials used for a hole injection layer of organic light-emitting devices can be selectively used. As the materials for the hole transport layer, any organic or inorganic substance having a function of either hole injection or electron barrier characteristics may be used. As specific examples of such substances, substances disclosed in Japanese Patent Application Laid-open No. 8-248276 can be given.

Electron Transport Layer

In the case of using an organic light-emitting layer in the light-emitting device section, an electron transport layer may be formed between the electrode layer (cathode) and the organic light-emitting layer, as required. Materials for the electron transport layer are only required to have a function of transferring electrons injected from the cathode to the organic light-emitting layer. Such materials can be selected from conventional substances. For example, a substance disclosed in Japanese Patent Application Laid-open No. 8-248276 can be given as a specific example.

Electrode Layer

As the cathode, electron injectable metals, alloys, electrically conductive compounds with a small work function (for example, 4 eV or less), or mixtures thereof can be used. Materials disclosed in Japanese Patent Application Laid-open No. 8-248276 can be given as specific examples of such electrode substances.

As the anode, metals, alloys, electrically conductive compounds with a large work function (for example, 4 eV or more), or mixtures thereof can be used. In the case of using optically transparent materials as the anode, transparent conductive materials such as CuI, ITO, $SnO_2$, and ZnO can be used. In a case where transparency is not necessary, metals such as gold can be used.

The optical section can be formed by conventional methods without specific limitations. Typical examples of such methods are given below.

(1) Lithographic Method

A positive or negative resist is exposed to ultraviolet rays, X-rays, or the like and developed. Then the resist layer is patterned to form an optical section. As a patterning technology using a resist formed of polymethylmethacrylate or a novolak resin, technologies disclosed in Japanese Patent Applications Laid-open No. 6-224115 and No. 7-20637 can be given.

As a technology of patterning a polyimide using photolithography, technologies disclosed in Japanese Patent Applications Laid-open No. 7-181689 and No. 1-221741, and the like can be given. Furthermore, Japanese Patent Application Laid-open No. 10-59743 discloses a technology of forming an optical section of polymethylmethacrylate or titanium oxide on a glass substrate utilizing laser ablation.

(2) Formation of Refractive Index Distribution by Irradiation

The optical waveguide section of the optical waveguide is irradiated with light having a wavelength which produces changes in the refractive index to periodically form areas having different refractive indices on the optical waveguide section, thereby forming an optical section. As such a method, it is appropriate to form an optical section by forming a layer of polymers or polymer precursors and polymerizing part of the polymer layer by irradiation or the like to periodically form areas having different refractive indices. Such a technology is disclosed in Japanese Patent Applications Laid-open No. 9-311238, No. 9-178901, No. 8-15506, No. 5-297202, No. 5-39480, No. 9-211728, No. 10-26702, No. 10-8300, and No. 2-51101, and the like.

(3) Stamping Method

An optical section is formed by, for example, hot stamping using a thermoplastic resin (Japanese Patent Application Laid-open No. 6-201907), stamping using an UV curable resin (Japanese Patent Application Laid-open No. 10-279439), or stamping using an electron-beam curable resin (Japanese Patent Application Laid-open No. 7-235075).

(4) Etching Method

A thin film is selectively patterned using lithography and etching technologies to form an optical section.

The methods for forming the optical section are described above. Specifically, the optical section formed of at least two regions, each having a different refractive index, and can be fabricated, for example, by a method of forming these two regions from two materials having different refractive indices, a method of forming the two regions from one material by partly modifying the material forming one of the two regions so that the two regions have different refractive indices, and the like.

Each layer of the light-emitting device can be formed by a conventional method. For example, each layer of the light-emitting device is formed using a suitable film-forming method depending on the materials therefor. As specific examples of such a method, a vapor deposition method, spin coating method, LB method, ink jet method, and the like can be can be given.

DESCRIPTION OF EMBODIMENTS
First Embodiment
Device

Figure 1:
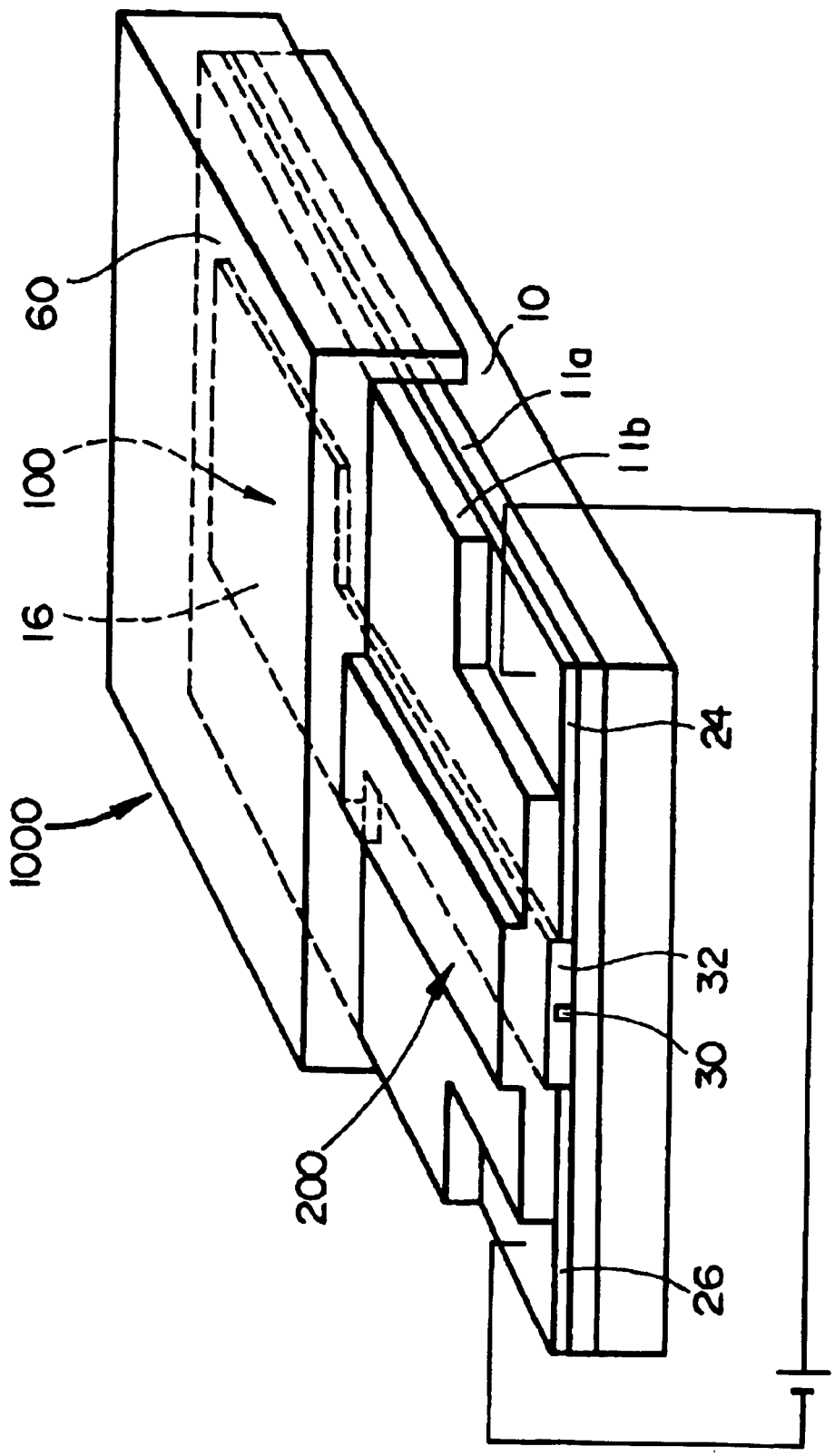
FIG. 1 is an oblique view schematically showing a light-emitting device according to a first embodiment of the present invention.
Figure 2:
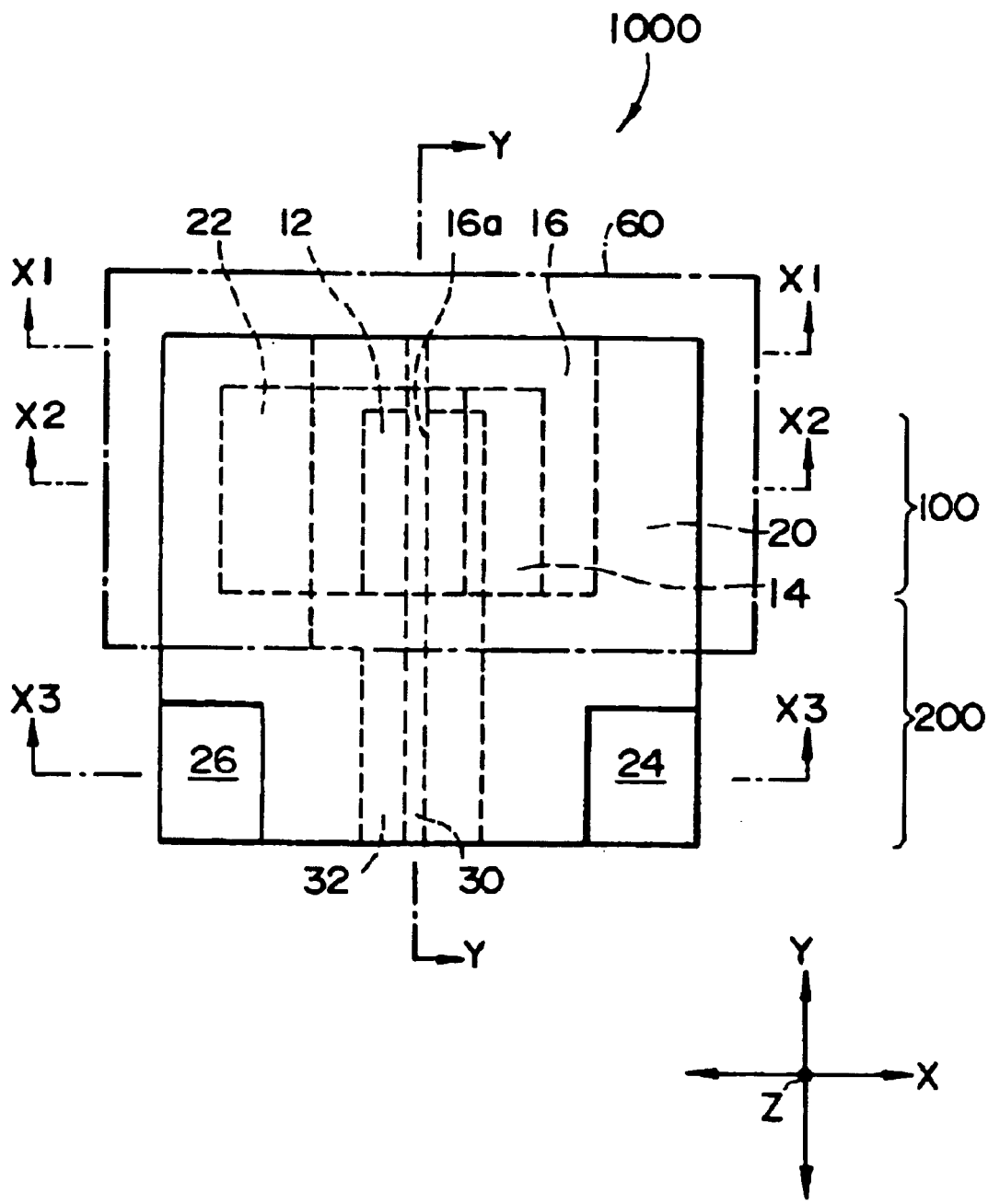
FIG. 2 is a plan view schematically showing the light-emitting device according to the first embodiment of the present invention.
Figure 3:
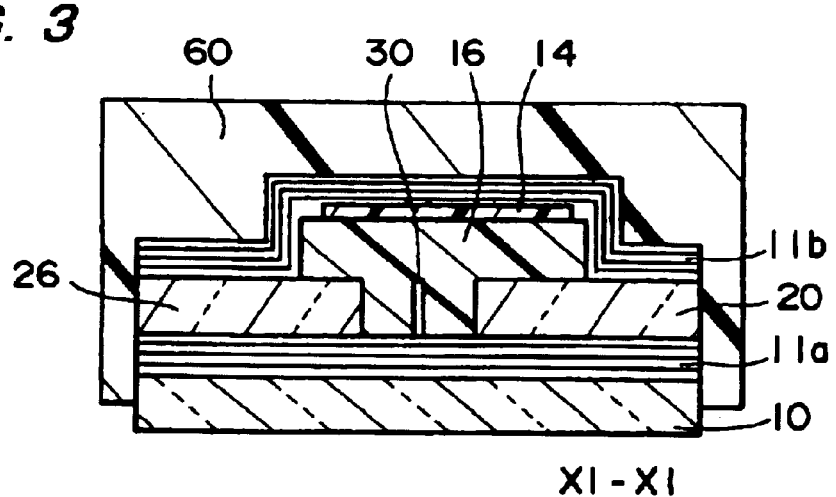
FIG. 3 is a cross-sectional view along the line X1—X1 shown in FIG. 2.
Figure 4:
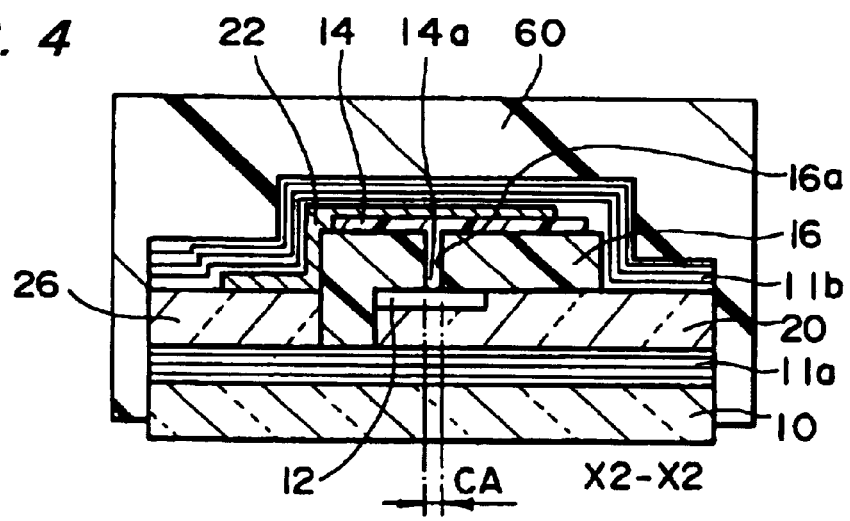
FIG. 4 is a cross-sectional view along the line X2—X2 shown in FIG. 2.
Figure 5:
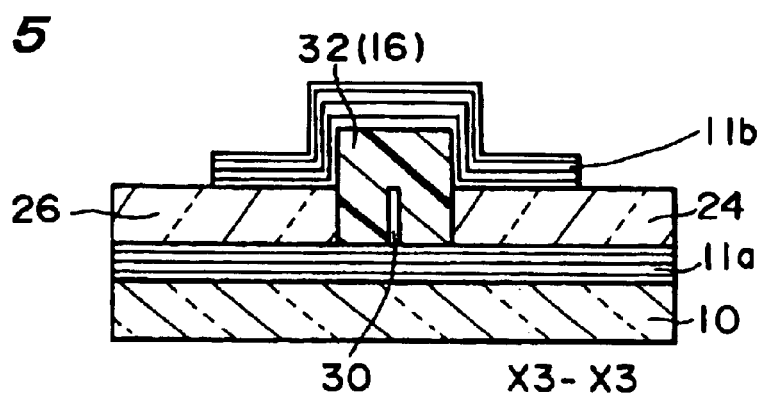
FIG. 5 is a cross-sectional view along the line X3—X3 shown in FIG. 2.
Figure 6:
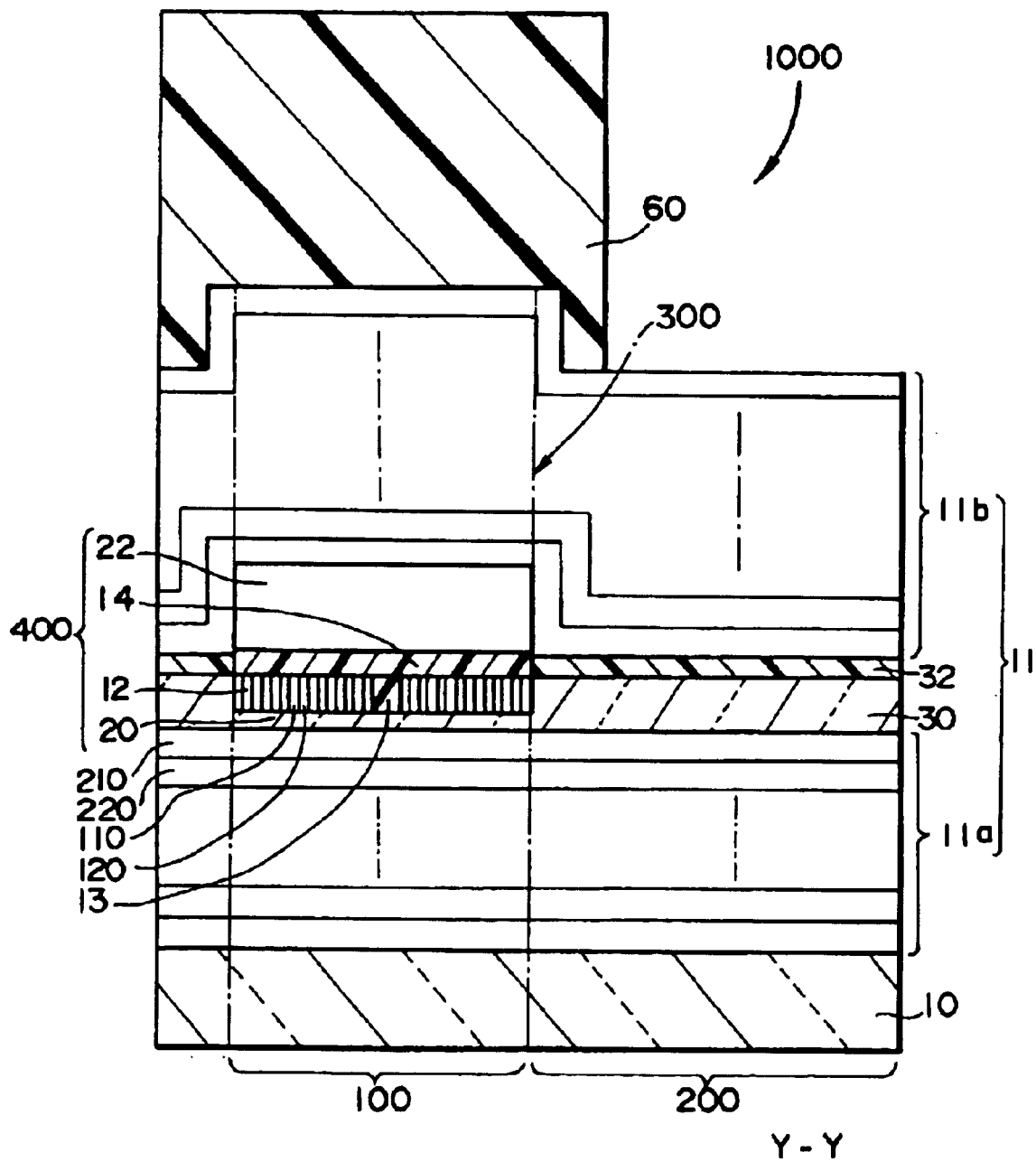
FIG. 6 is cross-sectional view along the line Y—Y shown in FIG. 2.

FIG. 1 is an oblique view schematically showing a light-emitting device 1000 according to the present embodiment. FIG. 2 is a plan view schematically showing the light-emitting device 1000. FIG. 3 is a cross-sectional view along the line X1—X1 shown in FIG. 2. FIG. 4 is a cross-sectional view along the line X2—X2 shown in FIG. 2. FIG. 5 is a cross-sectional view along the line X3—X3 shown in FIG. 2. FIG. 6 is a cross-sectional view along the line Y—Y shown in FIG. 2.

The light-emitting device 1000 includes a light-emitting device section 100 and a waveguide section 200.

The light-emitting device section 100 includes a dielectric multilayer film 11a, an anode 20, a first optical section 12, an organic light-emitting layer 14, a cathode 22, and a dielectric multilayer film 11b which are formed on a substrate 10, as shown in FIGS. 4 and 6. An optical section 300 is formed by a second optical section 11 formed of a laminate including the first optical section 12 and the dielectric multilayer films 11a and 1b as described later.

The waveguide section 200 includes the dielectric multilayer film 11a, a core layer 30, a cladding layer 32 which covers the exposed area of the core layer 30, and the dielectric multilayer film 11b which are formed on the substrate 10. A first electrode drawing section 24 and a second electrode drawing section 26 are disposed adjacent to the waveguide section 200.

In the present embodiment, a protective layer 60 is formed so as to cover the light-emitting device section 100. Deterioration of the cathode 22 and the light-emitting layer 14 can be prevented by covering the light-emitting device section 100 by the protective layer 60. In the present embodiment, in order to form the electrode drawing sections 24 and 26, the protective layer 60 is not formed over the entire area of the light-emitting device so as to expose the surface of the waveguide section 200. The protective layer 60 may be formed to cover the entire area of the light-emitting device, as required.

Each component of the light-emitting device section 100 is described below in detail.

The anode 20 in the light-emitting device section 100 is formed of an optically transparent conductive material and makes up the optical section. The anode 20 and the core layer 30 in the waveguide section 200 are continuously formed. As the transparent conductive material for forming the anode 20 and the core layer 30, the above-described materials such as ITO can be used. An insulation layer (cladding layer) 16 in the light-emitting device section 100 and the cladding layer 32 in the waveguide section 200 are continuously formed. There are no specific limitations to the material for forming the insulation layer 16 and the cladding layer 32 insofar as the material exhibits insulation and can confine light due to a refractive index lower than that of the anode 20 and that of the core layer 30.

In the light-emitting device section 100, the insulation layer 16 is formed to cover at least the exposed area of the first optical section 12, as shown in FIGS. 2 and 4. The insulation layer 16 has a slit opening 16a extending in the periodic direction of the first optical section 12, specifically, in the direction in which medium layers having different refractive indices are periodically arranged (Y direction in this example). The anode 20 and the cathode 22 are disposed in the area where the opening 16a is formed with the first optical section 12 and the light-emitting layer 14 interposed therebetween. The insulation layer 16 is interposed between the anode 20 and the cathode 22 in the area where the opening 16a is not formed. Therefore, the insulation layer 16 functions as a current concentrating layer. Because of this, when a specific voltage is applied to the anode 20 and the cathode 22, a current mainly flows through a region CA corresponding to the opening 16a. The current can be concentrated along the direction in which light is waveguided by forming the insulation layer (current concentrating layer) 16 in this manner, whereby light emission efficiency can be increased.

Figure 8:
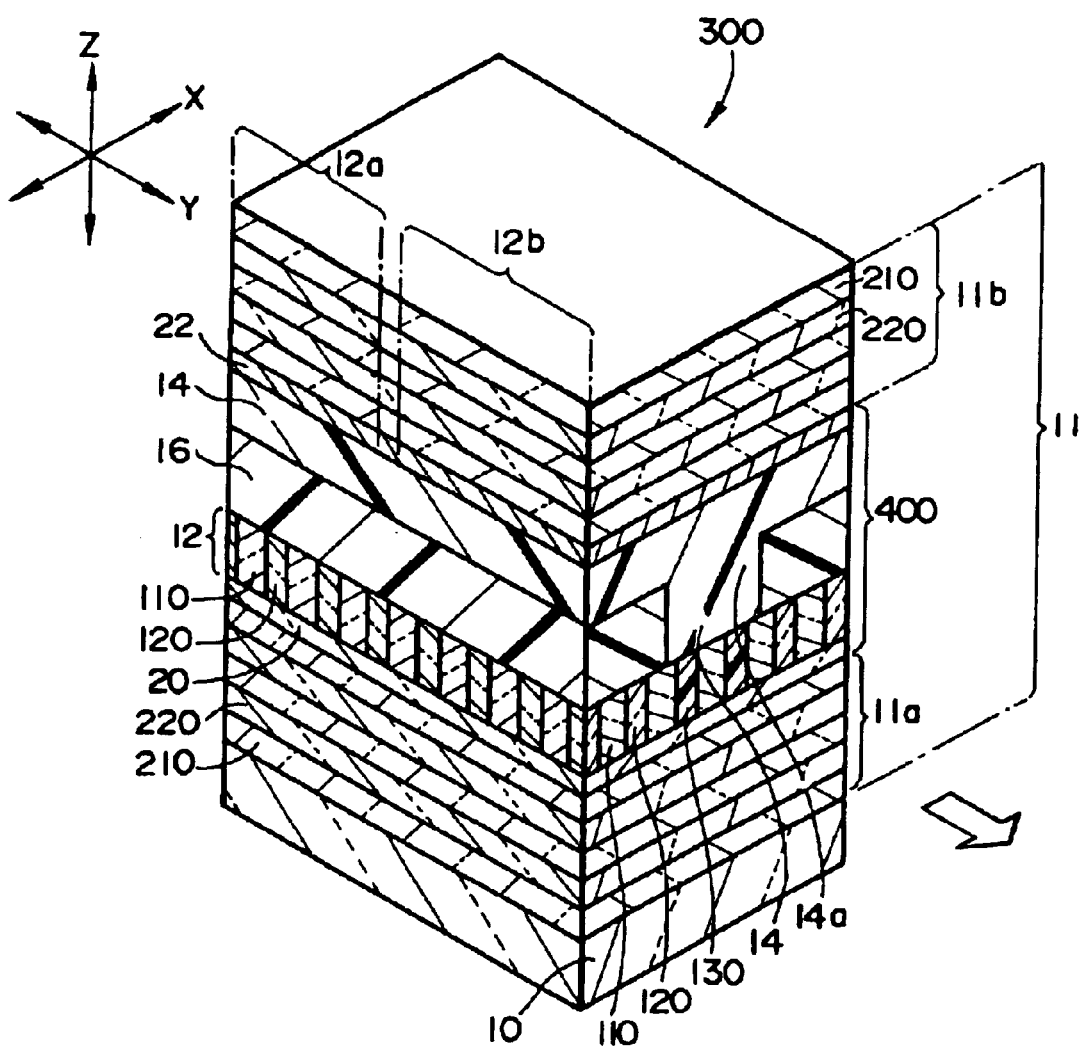
FIG. 8 is an oblique view schematically showing an optical section of the light-emitting device according to the first embodiment of the present invention.
Figure 9A:
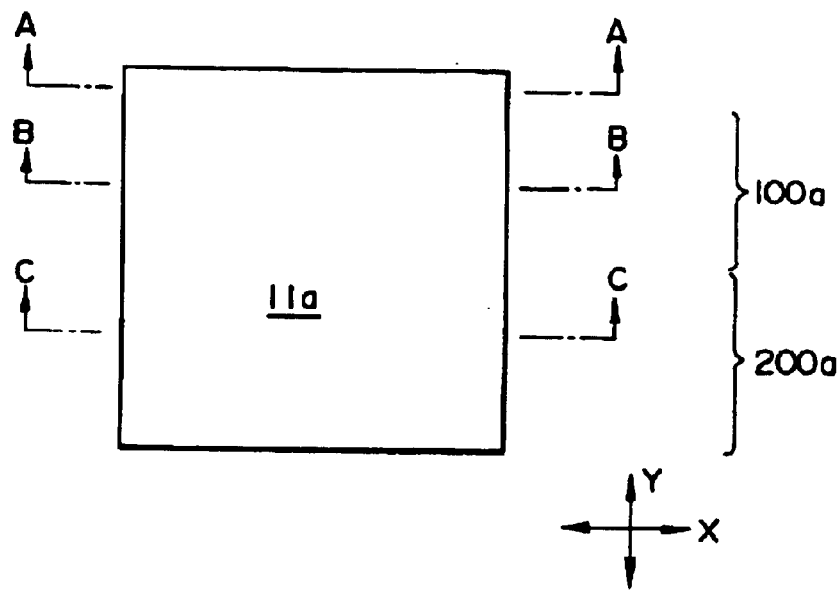
FIG. 9A is a plan view showing a fabrication step of the light-emitting device according to the first embodiment of the present invention.
Figure 9B:
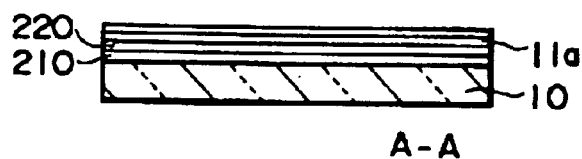
FIGS. 9B to 9D are cross-sectional views along the line A—A, line B—B, and line C—C shown in FIG. 9A, respectively.
Figure 9C:
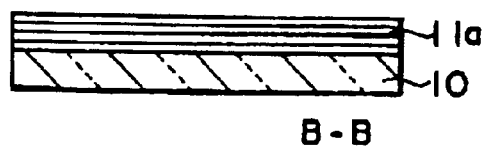
Figure 9D:
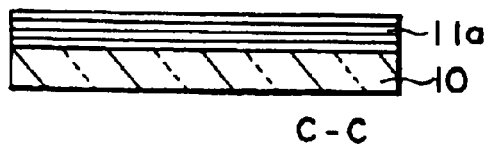
Figure 10A:
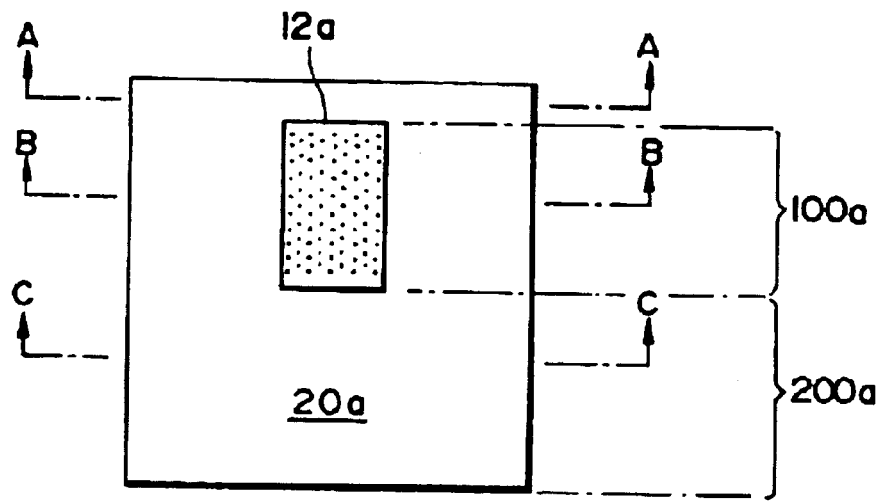
FIG. 10A is a plan view showing the fabrication step of the light-emitting device according to the first embodiment of the present invention.
Figure 10B:
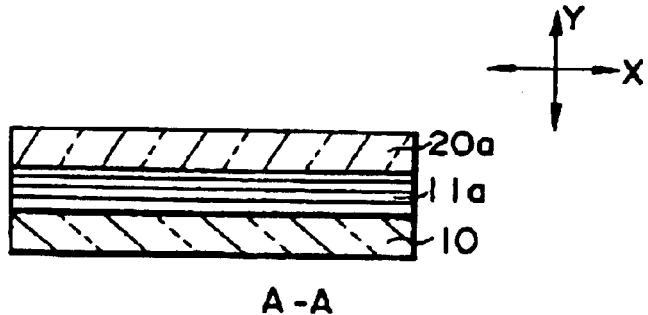
FIGS. 10B to 10D are cross sectional views along the line A—A, line B—B, and line C—C shown in FIG. 10A, respectively.
Figure 10C:
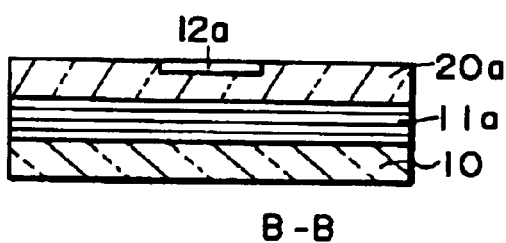
Figure 10D:
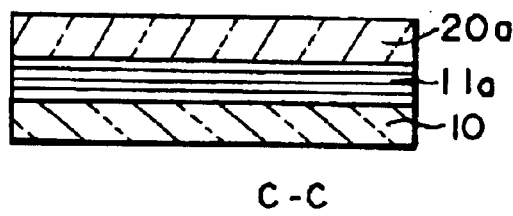
Figure 11A:
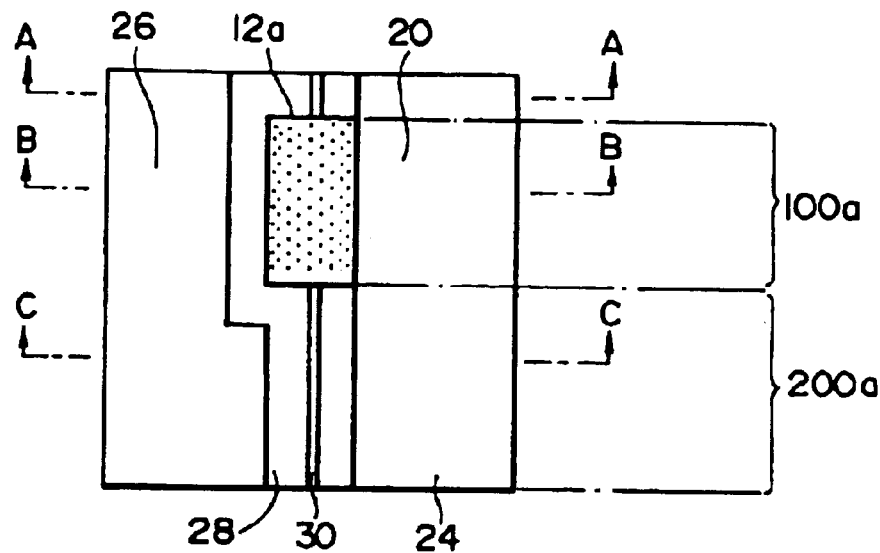
FIG. 11A is a plan view showing the fabrication step of the light-emitting device according to the first embodiment of the present invention.
Figure 11B:
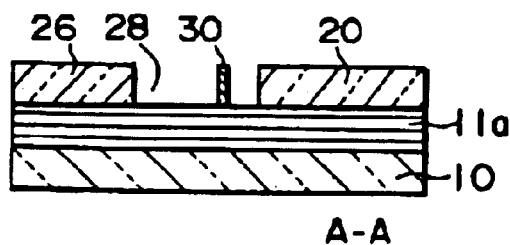
FIGS. 11B to 11D are cross-sectional views along the line A—A, line B—B, and line C—C shown in FIG. 11A, respectively.
Figure 11C:
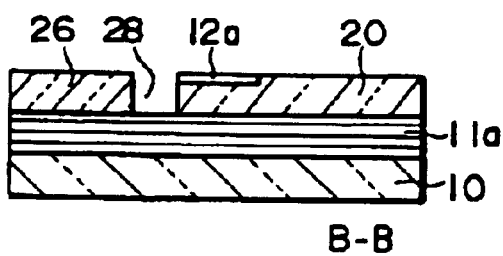
Figure 11D:
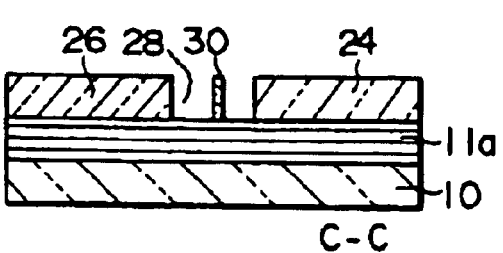
Figure 12A:
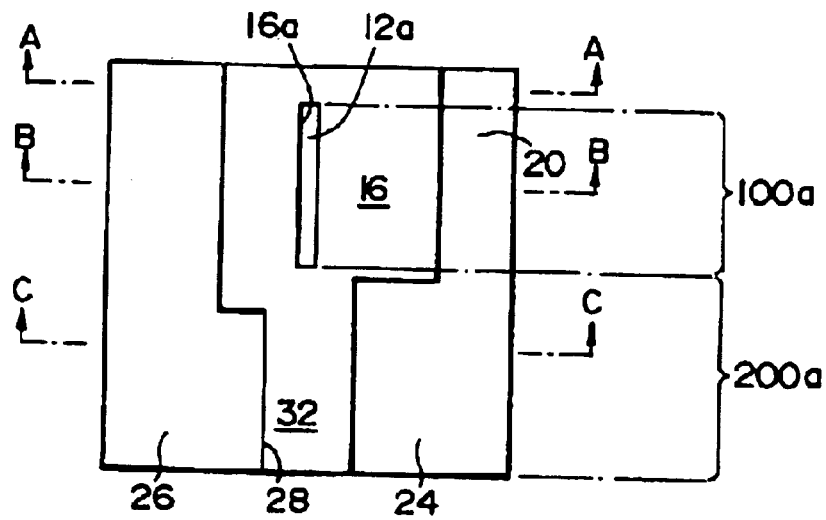
FIG. 12A is a plan view showing a fabrication step of the light-emitting device according to the first embodiment of the present invention.
Figure 12B:
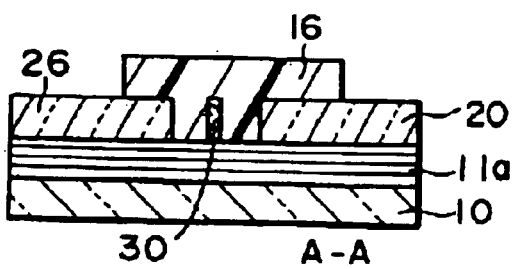
FIGS. 12B to 12D are cross-sectional views along the line A—A, line B—B, and line C—C shown in FIG. 12A, respectively.
Figure 12C:
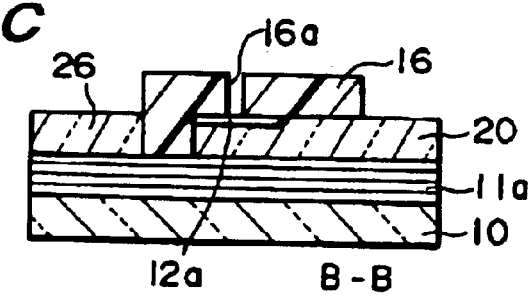
Figure 12D:
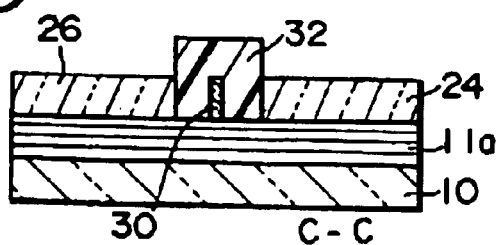

The optical section 300 is described below. FIG. 8 is an oblique view schematically showing the laminate which forms the optical section 300.

The optical section 300 is formed on the substrate 10 of the laminate including the dielectric multilayer film 11a, anode 20, first optical section 12, insulation layer 16, light-emitting layer 14, cathode 22, and dielectric multilayer film 11b.

The first optical section 12 has a periodic refractive index distribution in first, second, and third directions and forms two-dimensional photonic bandgaps to a specific spectrum range according to the shape (size) and the medium combination.

Figure 7:
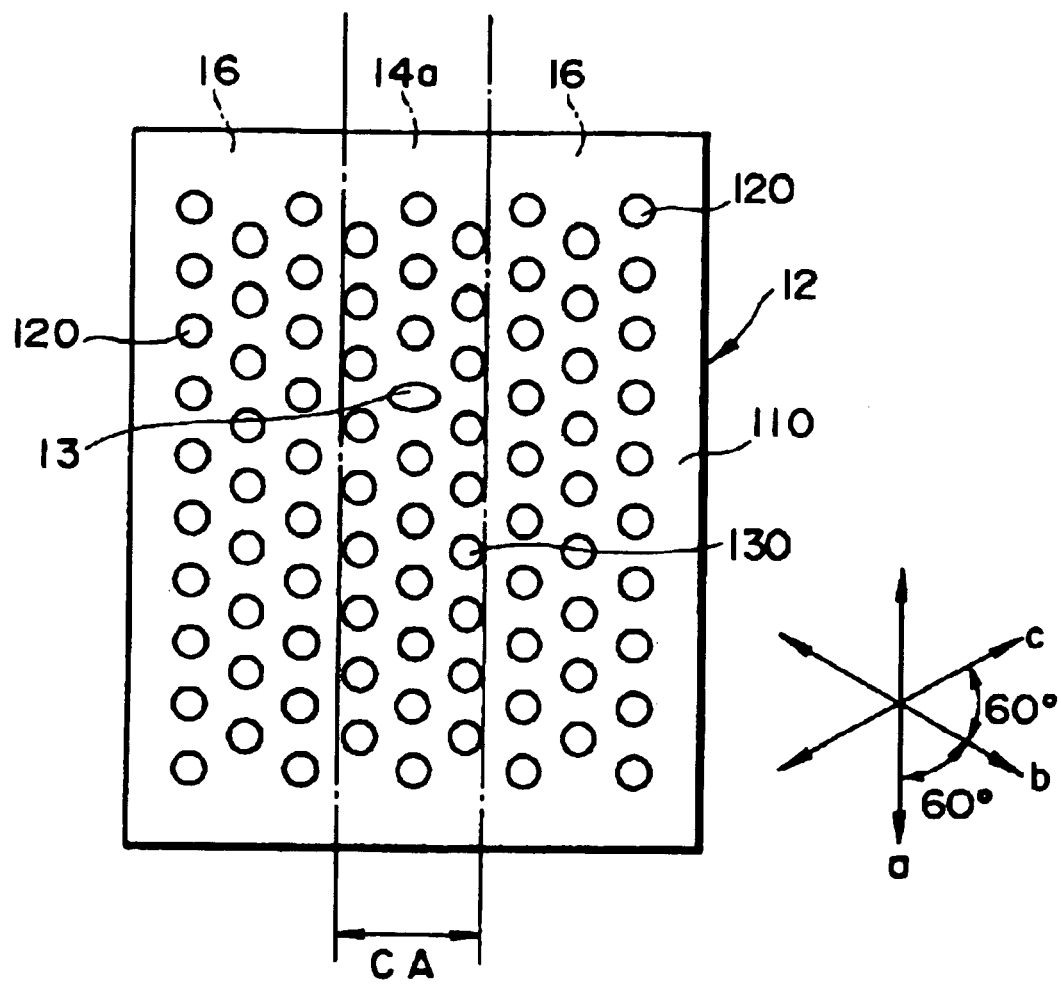
FIG. 7 is a plan view schematically showing a first optical section of the light-emitting device according to the first embodiment of the present invention.

More specifically, the first optical section 12 is formed in a triangular lattice, as shown in FIG. 7. In the first optical section 12, first medium layers 120 and 130 and second medium layers 110 having different refractive indices are arranged in a specific pattern. Specifically, the first medium layers 120 and 130 are arranged in a triangular lattice. The materials for the first medium layers 120 and 130 and the second medium layers 110 are not limited insofar as these layers can form photonic bandgaps by the periodic refractive index distribution. In the present embodiment, the first medium layers 120 are formed of the material for forming the insulation layer 16. The first medium layers 130 are formed of the material for forming the light-emitting layer 14 (light-emitting section 14a). The second medium layers 110 are formed of the material for forming the anode 20.

The first optical section 12 has a defect section 13. The defect section 13 is formed by irregularly forming part of the first medium layers 130. Specifically, the defect section 13 is formed of a medium layer having a shape differing from the first medium layers 130 disposed at the grating point. This medium layer is formed of the material for forming the light-emitting layer 14. The defect section 13 is formed so that the energy level caused by the defect is within the emission spectrum from the light-emitting layer 14 by electrical pumping.

In the first optical section 12, propagation of light is inhibited in two dimensions (XY surface) in at least three directions (a, b, and c directions), whereby light confinement becomes more perfect. This increases light emission efficiency.

The second optical section 11 has a periodic refractive index distribution in the Z direction and forms one-dimensional photonic bandgaps to a specific spectrum range according to the shape (size) and the medium combination. The first optical section 12 is formed in the middle in the periodic direction (direction in which different medium layers are repeated periodically) of the second optical section 11.

The second optical section 11 includes the lower dielectric multilayer film 11a and the upper dielectric multilayer film 11b in which first medium layers 210 and second medium layers 220 having different refractive indices are alternately arranged.

It is desirable that a laminated section 400 formed of the anode 20, first optical section 12, organic light-emitting layer 14, insulation layer 16, and cathode 22 make up at least a pair of gratings in the second optical section 11 in the Z direction so as not to function as the defect section for the second optical section 11. In this case, each layer which forms the laminated section 400 is almost optically transparent.

There are no specific limitations to the materials for the first medium layers 110, second medium layers 120, first medium layers 210, and second medium layers 220 insofar as these layers can form photonic bandgaps by the periodic refractive index distribution.

In the present embodiment, the defect section 13 in the first optical section 12 also functions as a light-emitting layer. The defect section 13 is formed in the first optical section 12 in the Y direction so that the energy level caused by the defect is within the emission spectrum from the organic light-emitting layer 14 by electrical pumping. On the other hand, the photonic bandgaps of the first optical section 12 in directions (b and c directions in FIG. 7) other than the Y direction (a direction in FIG. 7) and the photonic bandgaps of the second optical section 11 in the Z direction are set so that each photonic band gap includes at least the emission spectrum from the organic light-emitting layer 14 by electrical pumping, and the light emitted from the organic light-emitting layer 14 is not transferred in directions other than the Y direction at the XY surface and in the Z direction. Specifically, in the directions other than the Y direction at the XY surface, the light confinement conditions in directions other than the Y direction are set stronger than the light confinement conditions in the Y direction, whereby light is confined. In the Z direction, light is confined by the second optical section 11, in particular, the upper and lower dielectric multilayer films 11b and 11a in the laminated section 400.

In the present embodiment, the emitting light direction can be specified by, for example, providing a difference in the light confinement conditions between an optical section 12a on one side from the defect section 13 and an optical section 12a on the other side which makes up the first optical section 12 in the Y direction. In the case of causing light to be emitted from the right in the Y direction as shown in FIG. 8, for example, the light confinement conditions of the optical section 12a may be set weaker than the light confinement conditions of the other optical section 12b. Moreover, light with the same degree of intensity can be emitted from both sides of the first optical section 12 in the Y direction by setting the light confinement conditions of the optical sections 12a and 12b which makes up the first optical section 12 to be the same.

Sufficiency of the light confinement conditions in the optical section 300 can be controlled by the number of pairs of optical sections, the difference in the refractive indices of the medium layers which form the optical section, and the like, appropriately by the number of pairs of optical sections.

In the light-emitting device 1000 of the present embodiment, since light is confined by the first optical section 12 having photonic bandgaps in the first, second, and third directions at the XY surface and by the second optical section 11 having photonic bandgaps in the Z direction, propagation of light in three dimensions can be controlled. Light with a leaky mode can be propagated in other directions. In order to control the propagation of such a leaky mode light, a cladding layer or a dielectric multilayer mirror (not shown) may be optionally formed to confine the light. This also applies to other embodiments.

The first electrode drawing section 24 and the second electrode drawing section 26 adjacent to the waveguide section 200 are electrically isolated by the insulating cladding layer 32 continuously formed with the insulation layer 16. The first electrode drawing section 24 is continuous with the anode 20 in the light-emitting device section 100 and functions as a drawing electrode for the anode 20. The second electrode drawing section 26 is formed to extend toward the light-emitting device section 100. Part of the second electrode drawing section 26 is electrically connected to the cathode 22. Therefore, the second electrode drawing section 26 functions as a drawing electrode for the cathode 22. In the present embodiment, the first and second electrode drawing sections 24 and 26 are formed in the same deposition step as the anode 20.

The above-described methods and materials may be appropriately used as the method of fabricating the first and second optical sections 12 and 11 of the light-emitting device 1000 and the materials for forming each layer. These methods, materials, and structures also apply to other embodiments described later.

At least either a hole transport layer or an electron transport layer may be formed in the light-emitting device section, as required. This modification example also applies to other embodiments.

Device Operation

The operation and the action of the light-emitting device 1000 are described below.

Electrons and holes are injected into the light-emitting layer 14 respectively from the cathode 22 and the anode 20 by applying an appropriate voltage to both the anode 20 and the cathode 22. The electrons and holes are recombined in the light-emitting layer 14, whereby excitons are formed. Light such as fluorescent light or phosphorescent light is emitted when the excitons deactivate. Since the region CA (see FIG. 4) through which current flows is specified by the insulation layer 16 interposed between the anode 20 and the cathode 22 as described above, current can be efficiently supplied to the region from which light should be emitted.

Light emitted in the light-emitting layer 14 is introduced into the first optical section 12. Light with an energy level caused by the defect section 13 is propagated in the first optical section 12. Specifically, light with a spectrum range corresponding to the photonic bandgaps of the first optical section 12 cannot be propagated in the first optical section 12. The excitons produced in the defect section 13 are returned to the ground state at an energy level caused by the defect, whereby only light with a spectrum range corresponding to this energy level is generated. The light is propagated through the first optical section 12 toward the edge thereof (toward the waveguide section 200). The light is propagated through the core layer 30 in the waveguide section 200 continuously formed with the anode 20 and emitted from the edge thereof. Spontaneous emission of the emitted light in three dimensions is inhibited by the two-dimensional photonic bandgaps formed by the first optical section 12 and the one-dimensional photonic bandgaps formed by the second optical section 11. As a result, since only light with a specific spectrum range is emitted, the emitted light has wavelength selectivity, a narrow emission spectrum width, and excellent directivity.

Effect

Major effects of the present embodiment are given below.

(a) According to the light-emitting device 1000 of the present embodiment, the anode 20 and the cathode 22 are electrically connected through the light-emitting section 14a with which the opening 16a in the insulation layer 16 is filled. The region through which current flows is specified by the opening 16a. Therefore, since the insulation layer 16 functions as a current concentrating layer, current is efficiently supplied to the light-emitting region, thereby increasing light emission efficiency. The light-emitting region can be set while being aligned with the core layer 30 by specifying the region to which current is supplied by the current concentrating layer (insulation layer 16). This also increases light combination efficiency with the waveguide section 200.

(b) According to the light-emitting device 1000, electrons and holes are injected into the light-emitting layer 14 respectively from the cathode 22 and the anode 20. Light is emitted when the molecules return to the ground state from the excited state by allowing the electrons and holes to recombine in the light-emitting layer. At this time, light with a wavelength in the photonic bandgaps of the first and second optical sections 12 and 11 cannot be propagated through the optical section 300. Only light with a wavelength equivalent to the energy level caused by the defect 13 can be propagated through the first optical section 12 in a specific direction (Y direction). Therefore, light with a very narrow emission spectrum width with spontaneous emission being inhibited in three dimensions can be obtained with high efficiency by specifying the width of the energy level caused by the defect 13.

(c) The anode 20 on which the first optical section 12 is continuously formed with the core layer 30 in the waveguide section 200. This allows the light-emitting device section 100 and the waveguide section 200 to be optically combined with high combination efficiency, thereby ensuring efficient light propagation. The anode 20 and the core layer 30 can be deposited and patterned in the same step, thereby simplifying the fabrication.

The insulation layer (cladding layer) 16 in the light-emitting device section 100 is continuously formed with the cladding layer 32 in the waveguide section 200. This allows the light-emitting device section 100 and the waveguide section 200 to be optically combined with high combination efficiency, thereby ensuring efficient light propagation. The insulation layer 16 and the cladding layer 32 can be deposited and patterned in the same step, thereby simplifying the fabrication.

As described above, according to the light-emitting device 1000 of the present embodiment, the light-emitting device section 100 and the waveguide section 200 can be connected with high combination efficiency, whereby light can be emitted with high efficiency.

(d) In the present embodiment, the first optical section 12 and the second optical section 11 can be formed of either an organic material or inorganic material. Therefore, the light-emitting device 1000 is less affected by the irregular state and impurities of the boundary areas of the medium layers in the optical section than in the case of using semiconductors as the material for the optical section, whereby excellent photonic band gap characteristics can be obtained.

Moreover, in the case of forming the medium layers for forming the optical section using organic material layers, fabrication becomes easy and a periodic structure with an effective refractive index can be obtained, whereby superior photonic band gap characteristics can be obtained.

(e) The light-emitting device 1000 of the present embodiment has the organic light-emitting layer 14. Therefore, the light-emitting device 1000 is less affected by the irregular state and impurities of the boundary areas of the light-emitting layer than in the case of using semiconductors, whereby excellent photonic band gap characteristics can be obtained.

These effects also apply to other embodiments.

Fabrication Process

A fabrication example of the light-emitting device 1000 according to the present embodiment is described below with reference to FIGS. 9 to 16. In FIGS. 9 to 13, (A) shows a plan view and (B) to (D) show cross-sectional views along any of the line A—A, line B—B, and line C—C shown in (A). Symbols 100a and 200a in FIGS. 9 to 16 respectively show regions in which the light-emitting device section 100 and the waveguide section 200 are formed.

(1) Formation of Dielectric Multilayer Film

The dielectric multilayer film 11a which forms one-dimensional photonic bandgaps is formed, as shown in FIGS. 9A to 9D. The dielectric multilayer film 11a is formed so as to function as photonic bandgaps to light with a specific wavelength (light within the emission spectrum). Specifically, the dielectric multilayer film 11a has a periodic refractive index distribution in the direction of the thickness of the substrate 10 by alternately forming two medium layers 210 and 220 having different refractive indices.

(2) Formation of Conductive Layer and Optical Section

The conductive layer 20a is formed on the dielectric multilayer film 11a formed on the substrate 10 using an optically transparent conductive material, as shown in FIGS. 10A to 10D. The method of forming the conductive layer 20a is appropriately selected according to the material for the conductive layer 20a and the like. The above-described method can be used. In the case of forming the conductive layer 20a using ITO, for example, a deposition process is suitably used.

A concave-convex section 12a for forming one of the medium layers in the optical section which forms the photonic bandgaps is formed on the surface of the conductive layer 20a, in the region 100a in which the light-emitting device section 100 is formed. The pattern of the concave-convex section 12a which is not illustrated in FIG. 10A corresponds to the pattern shown in FIG. 7. The method of forming the concave-convex section 12a is appropriately selected according to the material for the conductive layer 20a and the like. The above-described method such as lithography and stamping can be used. In the case where the conductive layer 20a is formed using ITO, for example, the concave-convex section 12a may be formed using lithography and etching, or a liquid phase process such as an ink jet process using liquid ITO.

The anode 20, the first and second electrode drawing sections 24 and 26, and the core layer 30 are formed by patterning the conductive layer 20a shown in FIG. 10 by lithography, for example, as shown in FIGS. 11A to 11D.

The anode 20 and the first electrode drawing section 24 are continuously formed. The second electrode drawing section 26 is isolated from the anode 20 and the first electrode drawing section 24 by an opening 28. The concave-convex section 12a for the first optical section is integrally formed with the anode 20. Part of the anode 20 including the concave-convex section 12a also functions as a light-propagating section. The core layer 30 is continuously formed with the anode 20 (concave-convex section 12a), and is isolated from the first and second electrode drawing sections 24 and 26 by the opening 28.

As described above, the light-propagating section including the first optical section and the optical section such as the core layer can be simultaneously formed with the electrodes (anode and electrode drawing sections in this example) by selecting the material for the conductive layer 20a while taking into consideration the optical characteristics such as the refractive index.

(3) Formation of Insulation Layer

The insulation layer 16 with a specific pattern is formed so that the opening 28 is filled therewith, as shown in FIGS. 12A to 12D. The insulation layer 16 has the opening 16a which exposes part of the concave-convex section 12a for the first optical section. The opening 16a is formed in the shape of a slit extending along the direction in which light is waveguided. Since the region through which current flows is specified by the opening 16a, the length and the width of the opening 16a are set while taking into consideration the desired current density, current distribution, and the like. Since the insulation layer 16 functions not only as the current concentrating layer but also as the cladding layer to confine light, the material therefor is selected while taking into consideration insulation and the optical characteristics such as the refractive index. The material for forming the insulation layer 16 with which the concavity of the concave-convex section 12a for the first optical section is filled makes up the first optical section 12. Therefore, as the material for forming the insulation layer 16, a material exhibiting insulation functions as well as optical functions when forming one of the medium layers in the first optical section 12 which forms the photonic bandgaps is selected.

In the case of using ITO as the conductive layer, polyimide, polyamide, polyethyleneterephthalate, polyether sulfone, silicon polymer, or the like can be used as the insulation layer 16.

The insulation layer 16 electrically isolates the anode 20 and the first electrode drawing section 24 from the second electrode drawing section 26. Moreover, the insulation layer 16 functions as a cladding layer which covers part of the concave-convex section 12a for the first optical section. The insulation layer 16 forms the cladding layer 32 which covers the exposed area of the core layer 30.

(4) Formation of Organic Light-emitting Layer

Figure 13A:
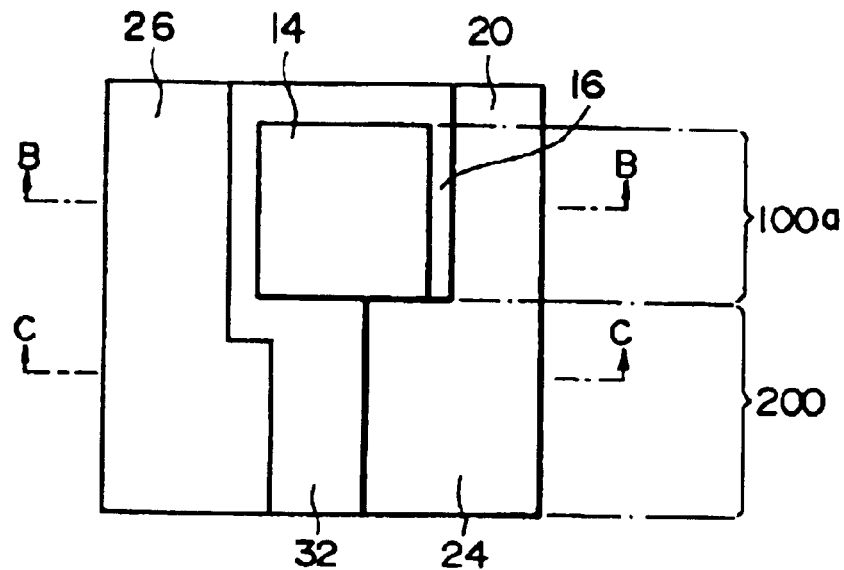
FIG. 13A is a plan view showing the fabrication step of the light-emitting device according to the first embodiment of the present invention.
Figure 13B:
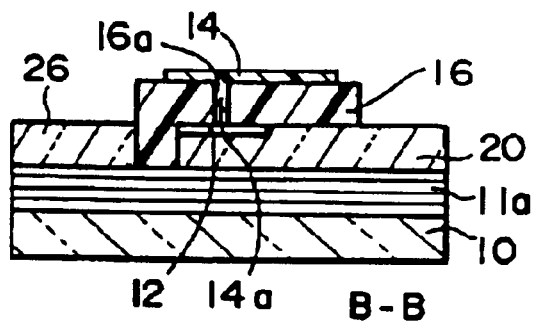
FIGS. 13B to 13C are cross-sectional views along the line B—B and the line C—C shown in FIG. 13A, respectively.
Figure 13C:
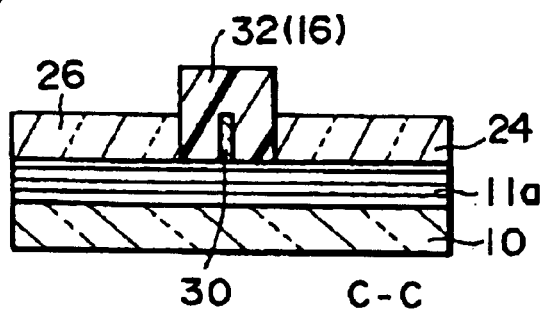

The light-emitting layer 14 is formed in a specific region of the region 100a in which the light-emitting device section 100 is formed, as shown in FIGS. 13A to 13C. The light-emitting layer 14 has the light-emitting section 14a in which at least the opening 16a formed in the insulation layer 16 is filled with a light-emitting material. The material for forming the organic light-emitting layer 14 with which the concavity of the concave-convex section 12a for the first optical section is filled makes up the first optical section 12. Therefore, as the material for forming the organic light-emitting layer 14, a material exhibiting emitting functions as well as optical functions when forming one of the medium layers in the first optical section 12 which forms the photonic bandgaps is selected.

(5) Formation of Cathode

Figure 14A:
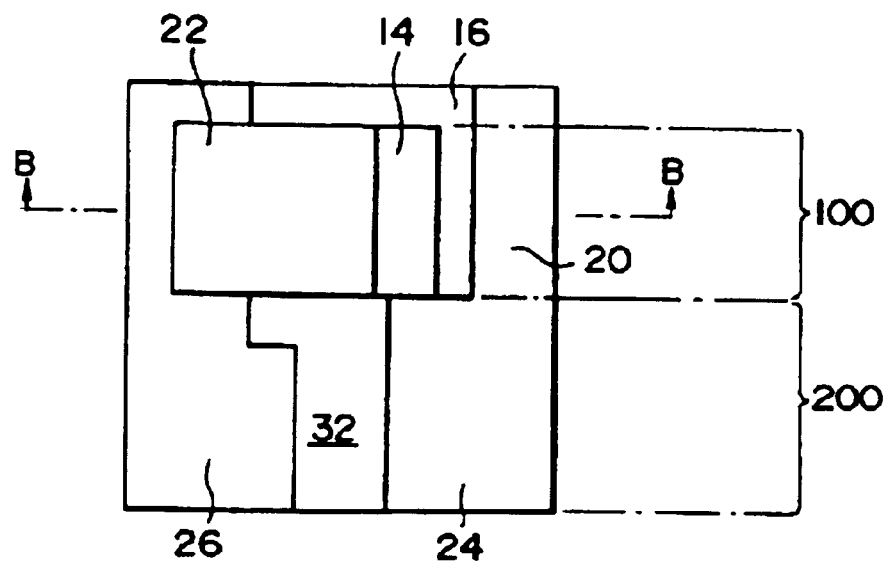
FIG. 14A is a plan view showing the fabrication step of the light-emitting device according to the first embodiment of the present invention.
Figure 14B:
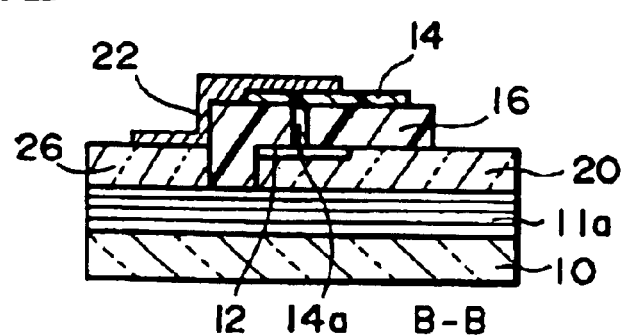
FIG. 14B is a cross-sectional view along the line B—B shown in FIG. 14A.

The cathode 22 is formed in the region 100a in which the light-emitting device section 100 is formed, as shown in FIGS. 14A and 14B. The cathode 22 is formed to cover the light-emitting section 14a of the organic light-emitting layer 14, with one end superposed on the second electrode drawing section 26. The light-emitting device section 100 and the waveguide section 200 are thus formed.

(6) Formation of Dielectric Multilayer Film

Figure 15A:
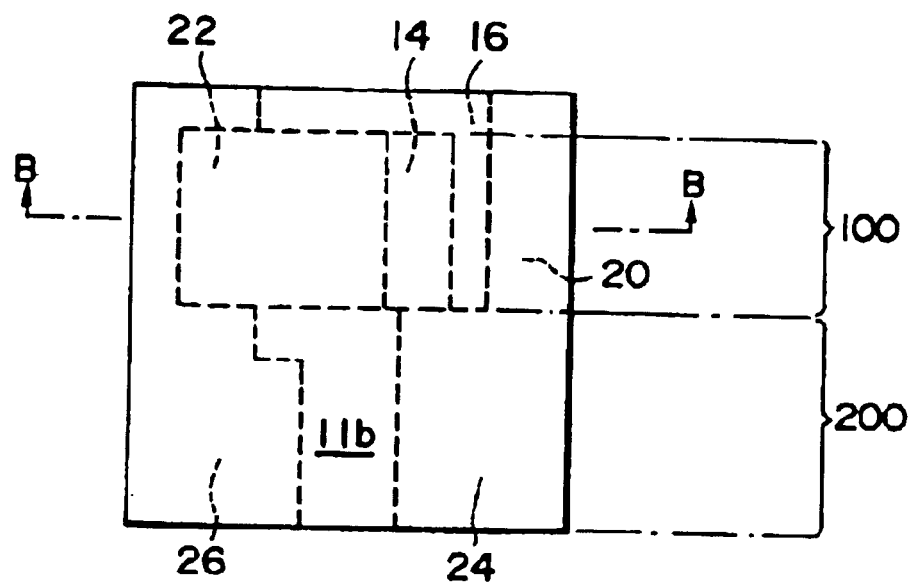
FIG. 15A is a plan view showing the fabrication step of the light-emitting device according to the first embodiment of the present invention.
Figure 15B:
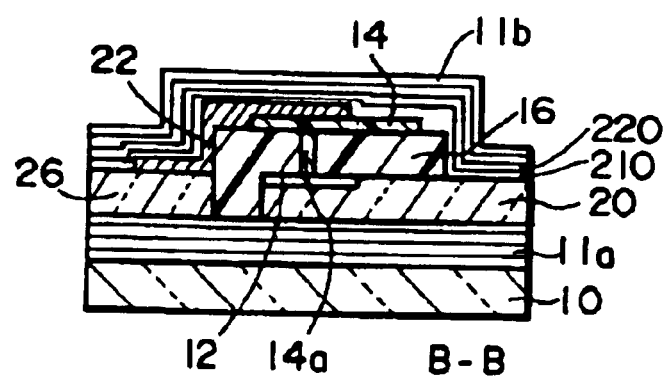
FIG. 15B is a cross-sectional view along the line B—B shown in FIG. 15A.

The dielectric multilayer film 11b which forms one-dimensional photonic bandgaps is formed as shown in FIGS. 15A and 15B. The dielectric multilayer film 11b is formed so as to function as the photonic bandgaps to light with a specific wavelength (light within the emission spectrum) in the same manner as the dielectric multilayer film 11a. Specifically, the dielectric multilayer film 11b has a periodic refractive index distribution in the direction of the thickness of the substrate 10 by alternately forming two medium layers 210 and 220 having different refractive indices.

(7) Formation of Protective Layer

Figure 16A:
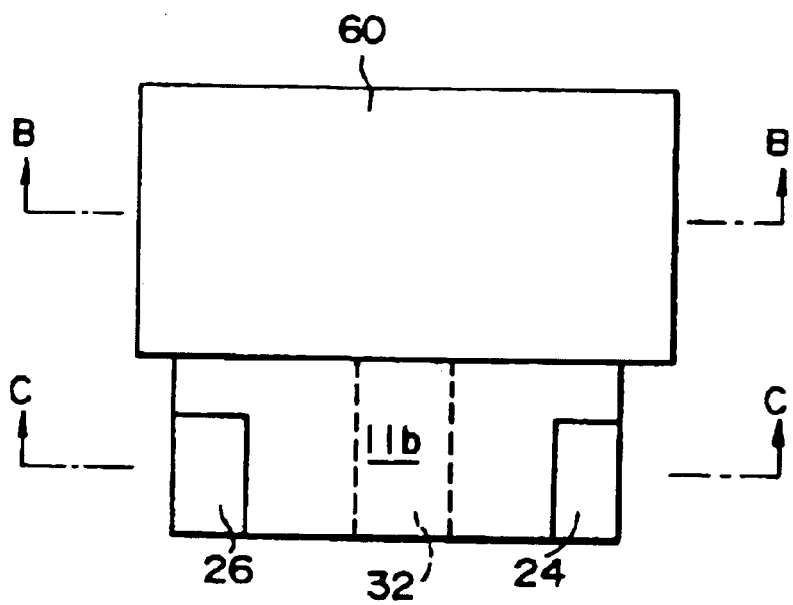
FIG. 16A is a plan view showing the fabrication step of the light-emitting device according to the first embodiment of the present invention.
Figure 16B:
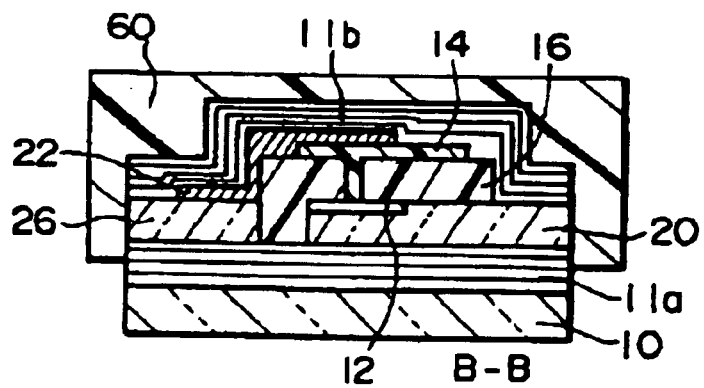
FIGS. 16B to 16C are cross-sectional views along the line B—B and the line C—C shown in FIG. 16A, respectively.
Figure 16C:
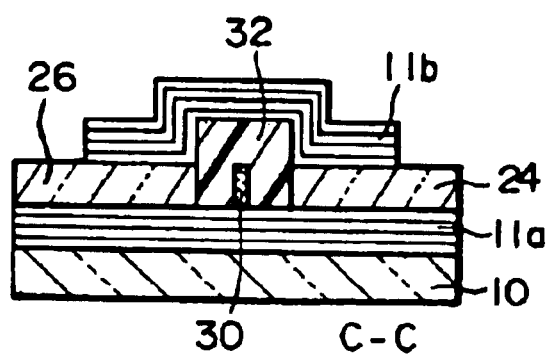

The protective layer 60 is optionally formed so as to cover at least the light-emitting device section 100, as shown in FIGS. 16A to 16C. It is desirable that the protective layer 60 be formed so that the cathode 22, the light-emitting layer 14, and the anode 20 do not come in contact with the outside. In particular, since the cathode 22 which is generally formed of an active metal and the organic light-emitting layer 14 which is formed of an organic material tend to be degraded by atmosphere or water, the protective layer 60 is formed so as to prevent such a degradation. The protective layer 60 is appropriately formed using a resin material such as an epoxy resin, silicone resin, or UV-curable resin.

The light-emitting device 1000 is formed by these steps. According to this fabrication method, the optical section such as the concave-convex section 12a for the first optical section and the core layer 30 can be simultaneously formed with the electrode sections (anode 20 and electrode drawing sections 24 and 26 in this example) by selecting the material for the conductive layer 20a while taking into consideration the optical characteristics such as the refractive index, thereby simplifying the fabrication.

Second Embodiment

Figure 17:
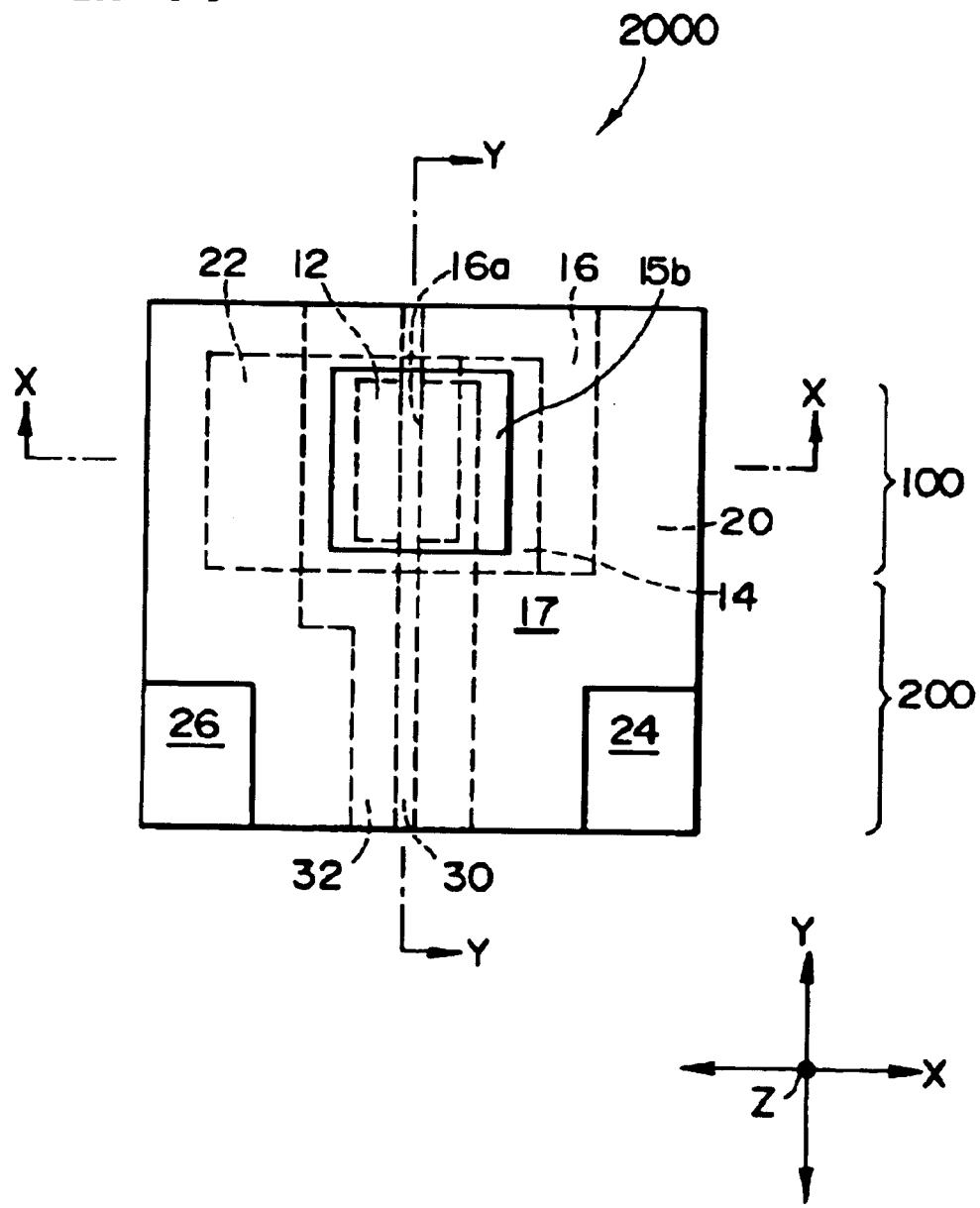
FIG. 17 is a plan view schematically showing a light-emitting device according to a second embodiment of the present invention.
Figure 18:
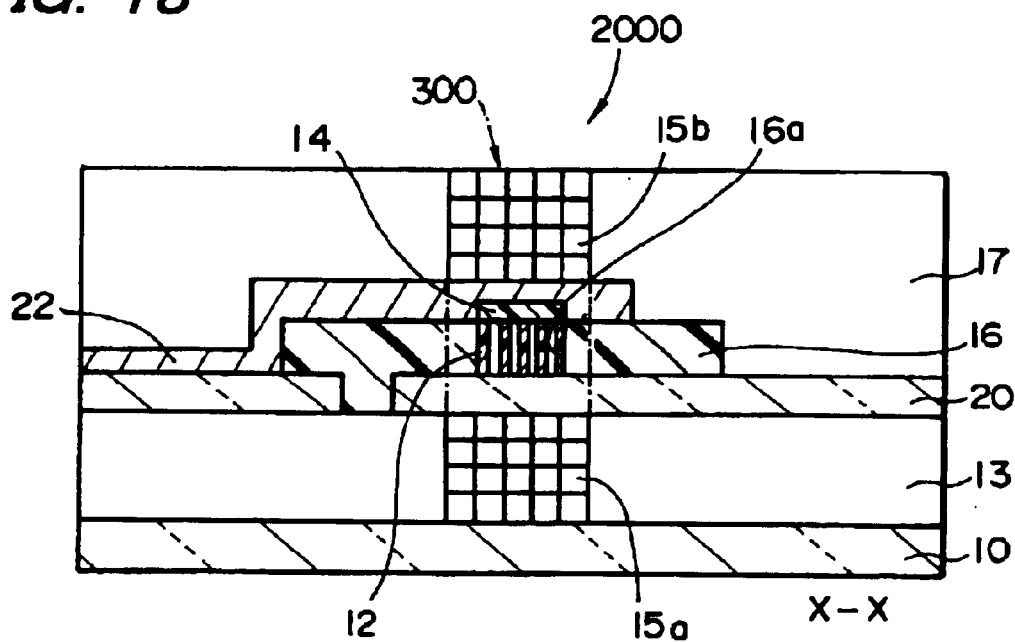
FIG. 18 is a cross-sectional view along the line X—X shown in FIG. 17.
Figure 19:
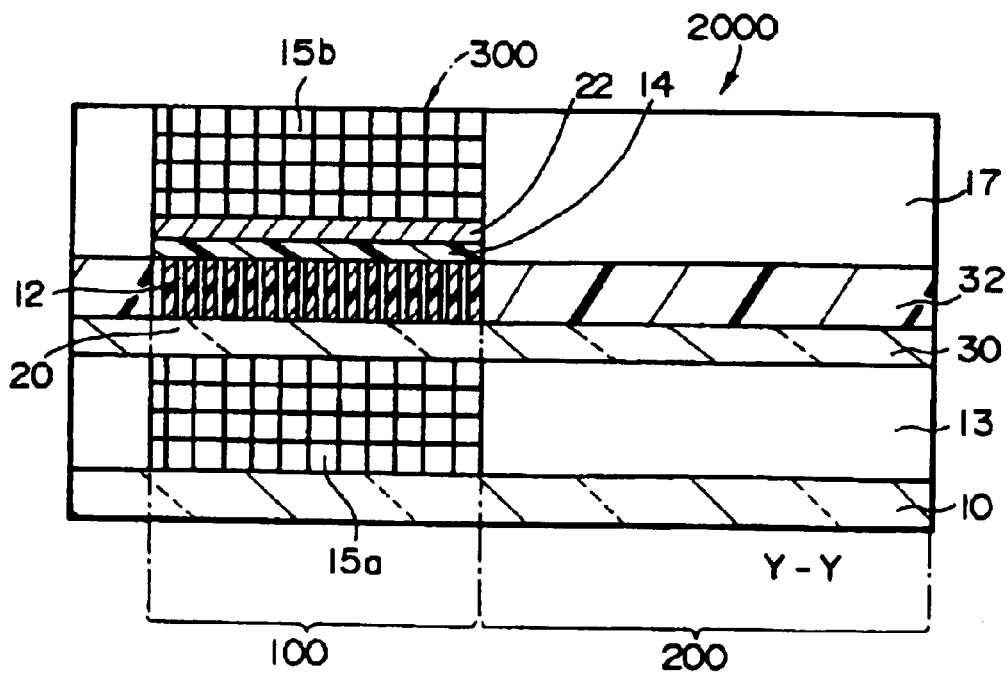
FIG. 19 is a cross-sectional view along the line Y—Y shown in FIG. 17.

FIG. 17 is a plan view schematically showing a light-emitting device 2000 according to the present embodiment. FIG. 18 is a cross-sectional view along the line X—X shown in FIG. 17. FIG. 19 is a cross-sectional view along the line Y—Y shown in FIG. 17. In the present embodiment, the same sections as those in the first embodiment are represented by the same symbols. Detailed description thereof is omitted. The present embodiment differs from the first embodiment as to the structure of the optical section. The following description mainly focuses on the difference between the present embodiment and the first embodiment.

The light-emitting device 2000 includes the light-emitting device section 100 and the waveguide section 200.

The light-emitting device section 100 includes a three-dimensional mosaic laminate 15a, the anode 20, the first optical section 12, the organic light-emitting layer 14, the cathode 22, and a three-dimensional mosaic laminate 15b which are formed on the substrate 10, as shown in FIGS. 18 and 19. The optical section 300 is formed by a laminate including the first optical section 12 and the three-dimensional mosaic laminates 15a and 15b as described later. A first insulation layer 13 formed on the substrate 10 is disposed to surround the lower three-dimensional mosaic laminate 15a. The anode 20 is disposed on the first insulation layer 13. A second insulation layer 17 formed on the exposed surfaces of the anode 20, insulation layer 16, and cathode 14 is disposed to surround the upper three-dimensional mosaic laminate 15b.

The waveguide section 200 includes the first insulation layer 13, the core layer 30, the cladding layer 32 which covers the exposed area of the core layer 30, and the second insulation layer 17 which are formed on the substrate 10. The first electrode drawing section 24 and the second electrode drawing section 26 are disposed adjacent to the waveguide section 200.

Each component of the light-emitting device section 100 is described below in detail.

Since the anode 20 in the light-emitting device section 100 and the core layer 30 and the cladding layer 32 in the waveguide section 200 are the same as in the first embodiment, detailed description of these components is omitted.

The insulation layer (cladding layer) 16 has the slit opening 16a formed in the periodic direction of the first optical section 12, specifically, in the direction in which medium layers having different refractive indices are periodically arranged (Y direction in this example). The present embodiment differs from the first embodiment in that the first optical section 12 is formed in the opening 16a. The insulation layer 16 is interposed between the anode 20 and the cathode 22 in the area where the opening 16a is not formed. Therefore, the insulation layer 16 functions as the current concentrating layer in the same manner as in the first embodiment. Because of this, when a specific voltage is applied to the anode 20 and the cathode 22, current flows through the first optical section 12 in the opening 16a. Current can be concentrated in the direction in which light is waveguided by forming the insulation layer (current concentrating layer) 16 in this manner, whereby light emission efficiency can be increased.

Figure 20:
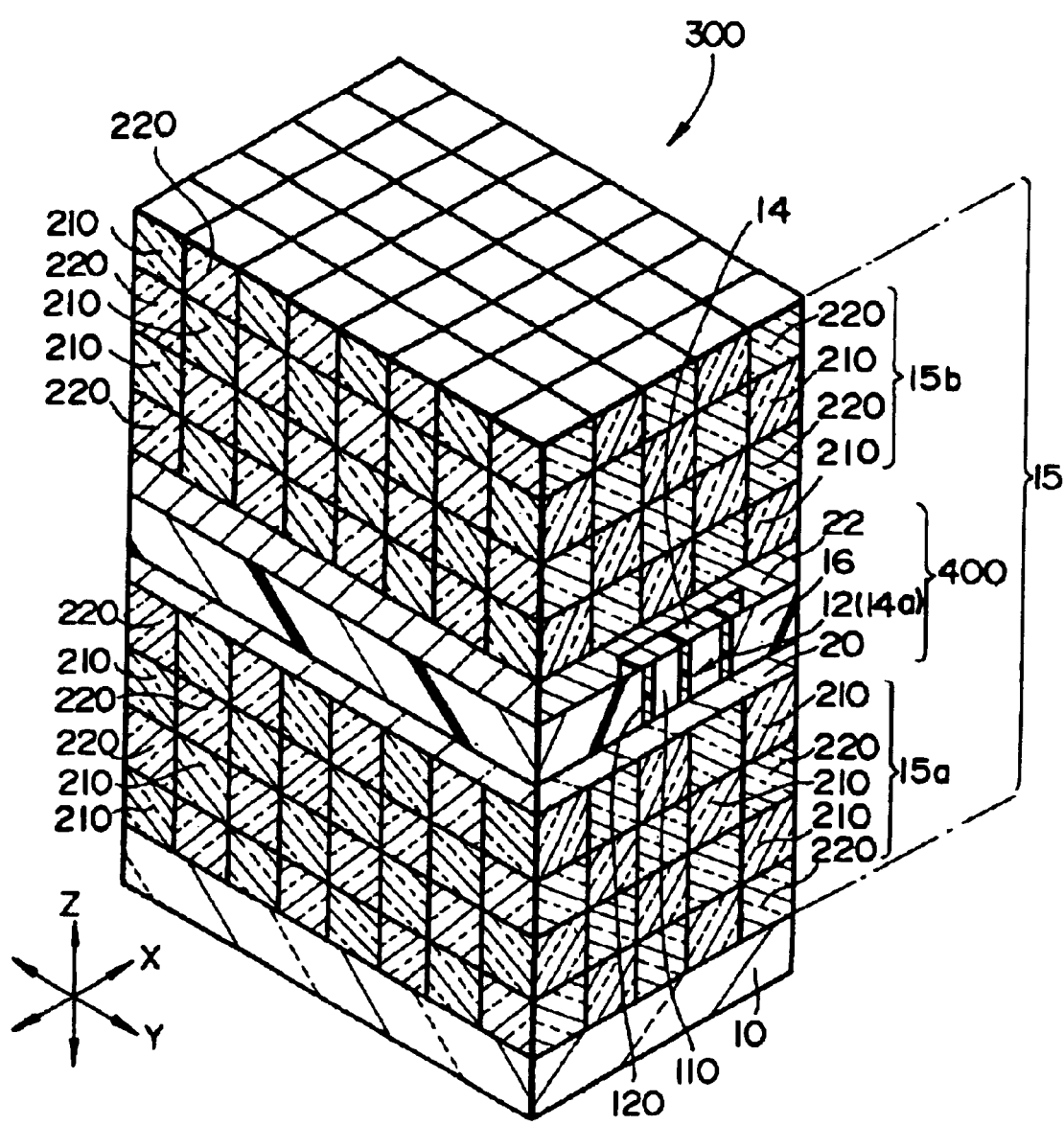
FIG. 20 is an oblique view schematically showing an optical section of the light-emitting device according to the second embodiment of the present invention.

The optical section 300 is described below. FIG. 20 is an oblique view schematically showing the laminate which forms the optical section 300.

The optical section 300 is formed on the substrate 10 and formed of the laminate including the three-dimensional mosaic laminate 15a, the anode 20, the first optical section 12, the insulation layer 16, the light-emitting layer 14, the cathode 22, and the three-dimensional mosaic laminate 15b.

The first optical section 12 has a periodic refractive index distribution in the first, second, and third directions and forms two-dimensional photonic bandgaps to a specific spectrum range according to the shape (size) and the medium combination.

More specifically, the first optical section 12 is formed in a triangular lattice in the same manner as in the first embodiment. In the optical section 12, the first medium layers 120 and the second medium layers 110 having different refractive indices are arranged in a specific pattern. Specifically, the first medium layers 120 are arranged in a triangular lattice. In the present embodiment, the first medium layers 120 are formed of the material for the light-emitting layer and becomes part of the light-emitting layer 14. The second medium layers 110 are formed of the material for the insulation layer 16.

The first optical section 12 has a defect section in the same manner as in the first embodiment. The defect section is formed so that the energy level caused by the defect is within the emission spectrum of the light-emitting layer 14 by the electrical pumping.

The three-dimensional mosaic laminates 15a and 15b which form the second optical section 15 have a periodic structure in which the first medium layers 210 and the second medium layers 220 are alternately arranged in each of the X, Y, and Z directions Specifically, the first medium layers 210 and the second medium layers 220 are arranged in a mosaic on all sides. Therefore, the second optical section 15 has a periodic refractive index distribution in each of the X, Y, and Z directions, and forms photonic bandgaps to a specific spectrum range in these three directions. The three-dimensional mosaic laminates 15a and 15b may be formed in the range so as to substantially contribute to light confinement. In this example, the three-dimensional mosaic laminates 15a and 15b have a width slightly greater than that of the first optical section 12 in the X direction, as shown in FIG. 18.

It is desirable that the laminated section 400 formed of the anode 20, first optical section 12, organic light-emitting layer 14, insulation layer 16, and cathode 22 makes up at least a pair of gratings of the second optical section 15 in the Z direction so as not to function as the defect section for the second optical section 15. In this case, each layer which forms the laminated section 400 is optically transparent.

The materials for the first medium layers 210 and the second medium layers 220 which form the three-dimensional mosaic laminates 15a and 15b are not limited insofar as each of these layers can form photonic bandgaps by periodic distribution. The first and second insulation layers 13 and 17 (see FIGS. 18 and 19) may be formed of the material for forming one of the medium layers which form the three-dimensional mosaic laminates 15a and 15b. In the case where the first and second insulation layers 13 and 17 function as protective layers, it is unnecessary to further provide a protective layer.

In the present embodiment, the first optical section 12 also functions as the light-emitting layer 14a. The first optical section 12 is formed so that the energy level caused by the defect is within the emission spectrum from the organic light-emitting layer 14 by electrical pumping in the Y direction. On the contrary, the photonic bandgaps of the first optical section 12 in directions other than the Y direction and the photonic bandgaps of the three-dimensional mosaic laminates 15a and 15b in the X, Y, and Z directions are set so that each photonic band gap includes at least the emission spectrum from the organic light-emitting layer 14 by electrical pumping. Specifically, the photonic bandgaps are set so that light emitted in the first optical section 12 is not propagated in directions other than the Y direction at the XY surface and in the three-dimensional mosaic laminates 15a and 15b in the X, Y, and Z directions.

From the viewpoint of light confinement, light is confined in directions other than the Y direction at the XY surface by setting the light confinement conditions in directions other than the Y direction stronger than the light confinement conditions in the Y direction. In the Z direction, light is confined by the second optical section 15, in particular, the upper and lower three-dimensional mosaic laminates 15a and 15b in the laminated section 400.

Sufficiency of the light confinement conditions in the optical section 300 can be controlled by the number of pairs of the optical sections, the difference in the refractive indices of the medium layers which form the optical section, and the like, appropriately by the number of pairs of optical sections.

In the light-emitting device 2000 of the present embodiment, since the light is confined by the first optical section 12 having photonic bandgaps in the first, second, and third directions at the XY surface and the second optical section 15 having photonic bandgaps in the X, Y, and Z directions, propagation of light in three dimensions can be controlled.

The first electrode drawing section 24 and the second electrode drawing section 26 disposed adjacent to the waveguide section 200 are the same as in the first embodiment.

Device Operation

The action and effect of the light-emitting device 2000 are described below.

Electrons and holes are injected into the light-emitting section 14a (first optical section 12) respectively from the cathode 22 and the anode 20 by applying an appropriate voltage to both the anode 20 and the cathode 22. Since the mechanism of light emission in the light-emitting section 14a and the mechanism of light propagation through the first optical section 12 are the same as in the first embodiment, the description thereof is omitted.

Light emitted in the first optical section 12 is propagated toward the waveguide section 200. The light is propagated through the core layer 30 in the waveguide section 200 continuously formed with the anode 20 and emitted from the edge thereof. Spontaneous emission of the emitted light in three dimensions is inhibited by the two-dimensional photonic bandgaps formed by the first optical section 12 and the three-dimensional photonic bandgaps formed by the second optical section 15. As a result, since only light with a specific spectrum range is emitted, the emitted light has wavelength selectivity, a narrow emission spectrum width, and excellent directivity.

Effect

The major effects of the present embodiment are the same as those of the first embodiment. The present embodiment can further achieve the following effects.

(a) The three-dimensional mosaic laminates 15a and 15b which make up the second optical section 15 have a periodic refractive index distribution in each of the X, Y, and Z directions and form photonic bandgaps to a specific spectrum range in these three directions. Therefore, light is confined more certainly in the vertical direction in comparison with the first embodiment, thereby increasing efficiency.

(b) The first optical section 12 is formed in the opening 16a. The first medium layer 120 in the first optical section 12 forms part of the organic light-emitting layer 14. According to this configuration, the light-emitting section 14a in which light is emitted and the first optical section 12 become the same region, whereby excellent current efficiency and light-emitting efficiency can be ensured.

Third Embodiment

Figure 21:
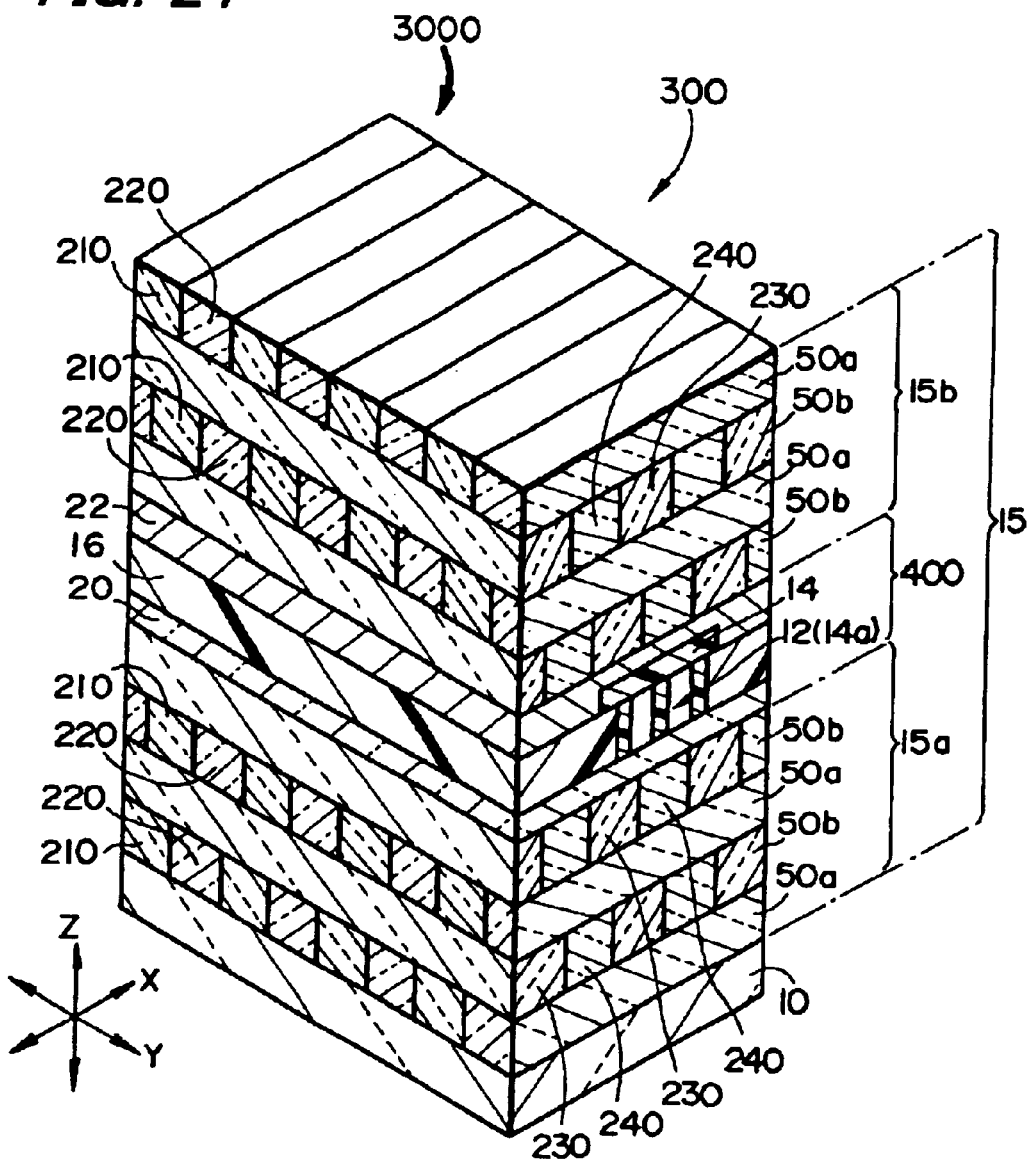
FIG. 21 is an oblique view schematically showing an optical section of a light-emitting device according to a third embodiment of the present invention.

FIG. 21 is an oblique view schematically showing the main portion (optical section 300) of a light-emitting device 3000 according to the present embodiment. The light-emitting device 3000 of the present embodiment has a basic structure similar to that of the light-emitting device 2000 of the second embodiment. The difference between these light-emitting devices is the structure of the three-dimensional mosaic laminates. The same sections as those of the light-emitting device 2000 of the second embodiment are represented by the same symbols. Detailed description of these sections is omitted.

The optical section 300 has a periodic structure in which medium layers having different refractive indices are arranged in each of the X, Y, and Z directions in the same manner as for the optical section 300 of the second embodiment. In the present embodiment, the shape and arrangement of the medium layers differ from the second embodiment.

Specifically, in the example shown in FIG. 21, the three-dimensional mosaic laminates 15a and 15b which make up the optical section 300 have a periodic structure in which first layers 50a and second layers 50b are alternately arranged in the Z direction. In the first layers 50a, the column-shaped first medium layers 210 and the column-shaped second medium layers 220 are alternately arranged in the Y direction. In the second layers 50b, column-shaped third medium layers 230 and column-shaped fourth medium layers 240 are alternately arranged in the X direction. The first layers 50a are disposed so that the boundary between the medium layers 210 and 220 is shifted between two adjacent first layers 50a. The second layers 50b are disposed so that the interface between the medium layers 230 and 240 is shifted between two adjacent second layers 50b.

Therefore, the optical section 300 has a periodic refractive index distribution in each of the X, Y, and Z directions and forms photonic bandgaps to a specific spectrum range in these three directions. At least one of the first and second medium layers 210 and 220 and at least one of the third and fourth medium layers 230 and 240 may be formed using the same material, or these layers may be formed using different materials.

In the periodic structure of the present embodiment, periodic refractive index distribution is provided in each of the three-dimensional mosaic laminates 15a and 15b which make up the optical section 300 in the X direction or Y direction by each layer which forms these laminates.

The light-emitting device of the present embodiment has the same effect as the light-emitting devices of the first and second embodiments. In the present embodiment, light can be confined in almost all directions other than the light-emitting direction.

Fourth Embodiment

Figure 24:
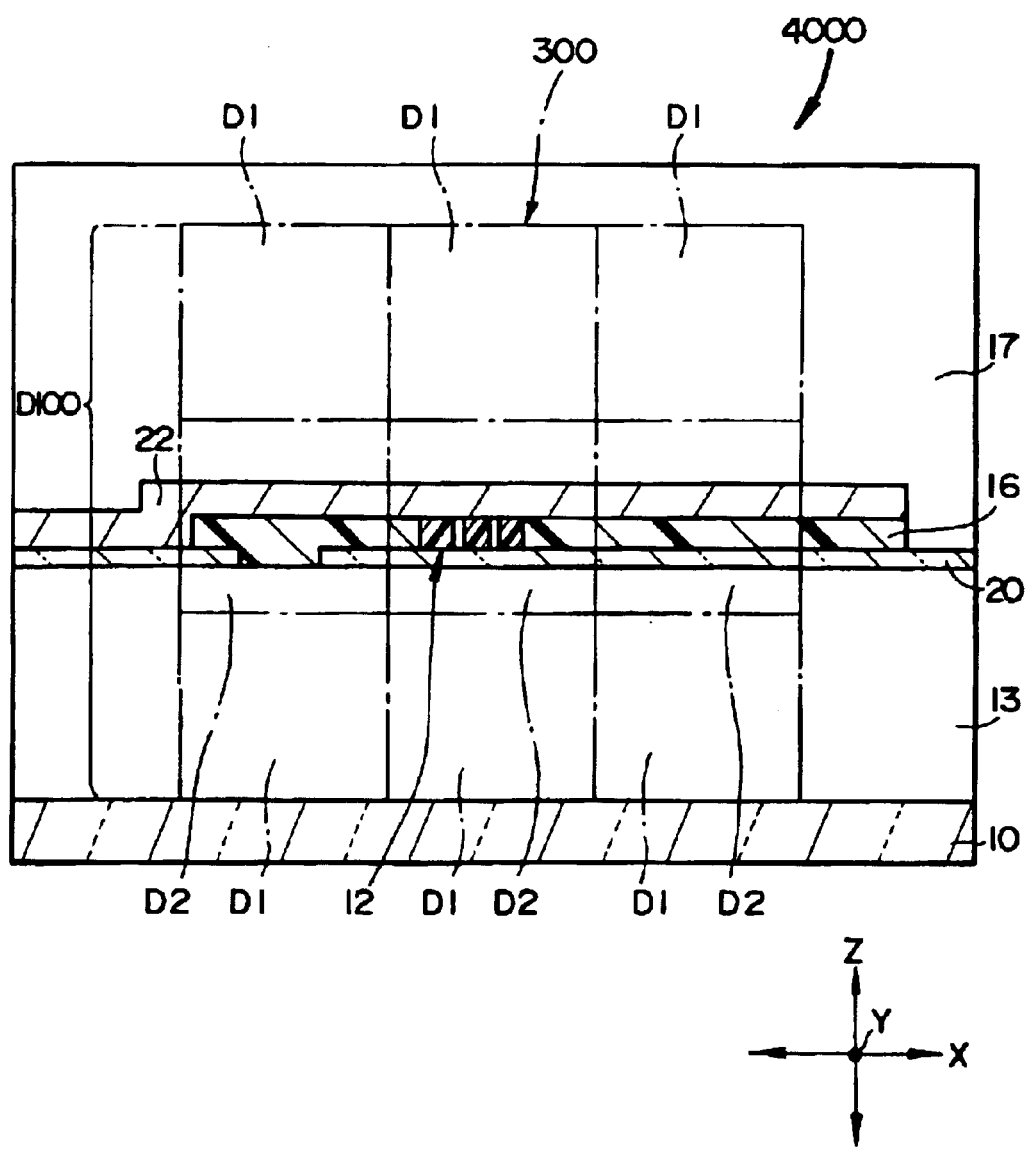
FIG. 24 is a cross-sectional view schematically showing a light-emitting device according to a fourth embodiment of the present invention.

FIG. 24 is a cross-sectional view schematically showing a light-emitting device 4000 according to the present embodiment. In the present embodiment, the same sections as those in the second embodiment are represented by the same symbols. Detailed description of these sections is omitted. The present embodiment differs from the first to third embodiments as to the configuration of the optical section. The following description mainly focuses on the difference between the present embodiment and the first to third embodiments. FIG. 24 is a cross-sectional view showing the light-emitting device section corresponding to FIGS. 4 and 18.

In the light-emitting device section, the optical section 300 with a diamond structure is formed on the substrate 10, as shown in FIG. 24. In this example, the optical section 300 has a structure in which three layers of unit cells D1, D2, and D1 of the diamond structure are layered in the Z direction. The unit cells of the diamond structure are disposed in three columns and three rows at the XY surface. The optical section 300 is enclosed by the first insulation layer 13 at the lower side from the anode 20 and the second insulation layer 17 at the upper side from the anode 20.

The optical section 300 includes the first optical section 12 and a second optical section D100 with a diamond structure which includes the first optical section 12.

The second optical section D100 includes the first unit cell D1 of the diamond structure having no defect and the second unit cell D2 of the diamond structure having a defect. In this example, the first unit cells D1 of the diamond structure (nine first unit cells D1 of the diamond structure in the first layer), the second unit cells D2 of the diamond structure (nine second unit cells D2 of the diamond structure in the second layer), and the first unit cells D1 of the diamond structure (nine first unit cells D1 of the diamond structure in the third layer) which are layered in the second optical section D100 in that order.

Figure 25:
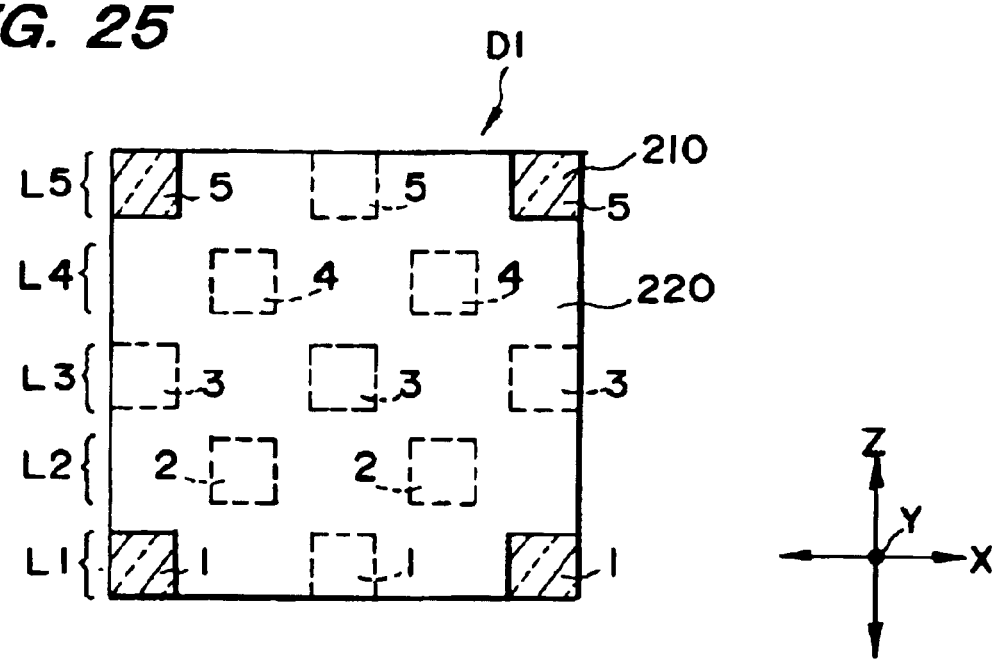
FIG. 25 is a view schematically showing a first unit cell of the diamond structure of an optical section of the light-emitting device shown in FIG. 24.

The first unit cell D1 of the diamond structure has the first medium layer 210 at a position corresponding to the grating point of the diamond structure, as shown in FIG. 25. The area between each first medium layer 210 is formed by the second medium layers 220.

Figure 27:
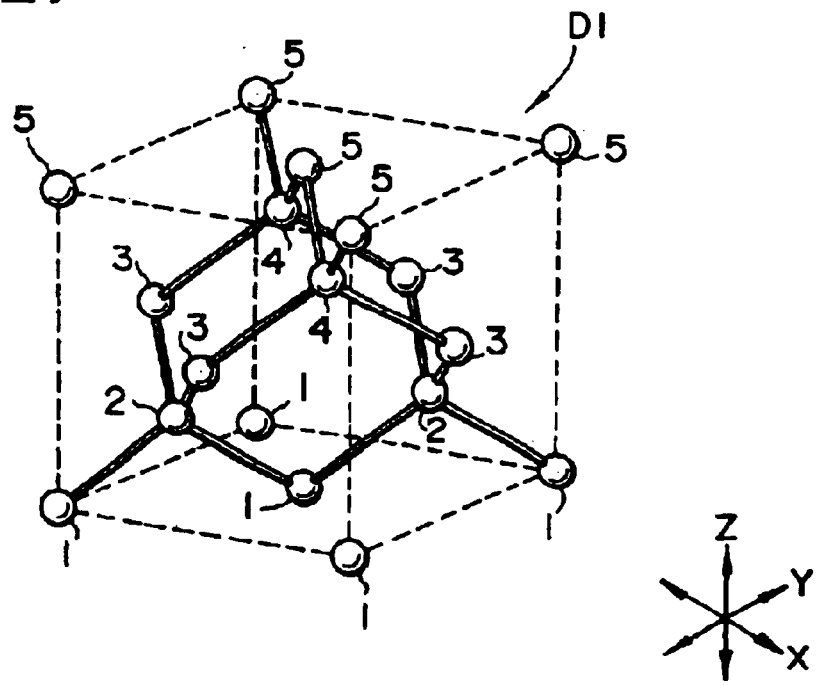
FIG. 27 is an oblique view showing the unit cell of the diamond structure of the light-emitting device shown in FIG. 24.
Figure 28:
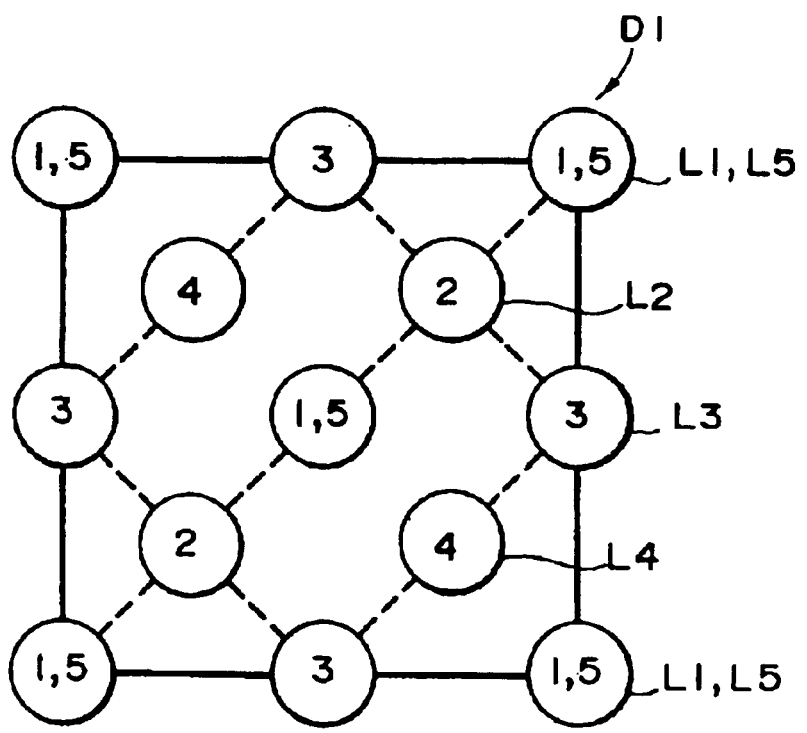
FIG. 28 is a plan view showing the unit cell of the diamond structure of the light-emitting device shown in FIG. 24.

FIG. 27 is an oblique view showing the unit cell of the diamond structure. FIG. 28 is a plan view showing the grating points. FIG. 25 is a view showing the unit cell D1 of the diamond structure viewed from the front in FIG. 27. In FIG. 25, symbols corresponding to levels L1 to L5 at each grating point are provided (see FIG. 28). As shown in these figures, the unit cell of the diamond structure has five grating points 1 at the first level (L1), two grating points 2 at the second level (1/4 pitch) (L2), four grating points 3 at the third level (2/4 pitch) (L3), two grating points 4 at the fourth level (3/4 pitch) (L4), and five grating points 5 at the fifth level (4/4 pitch) (L5).

Figure 29:
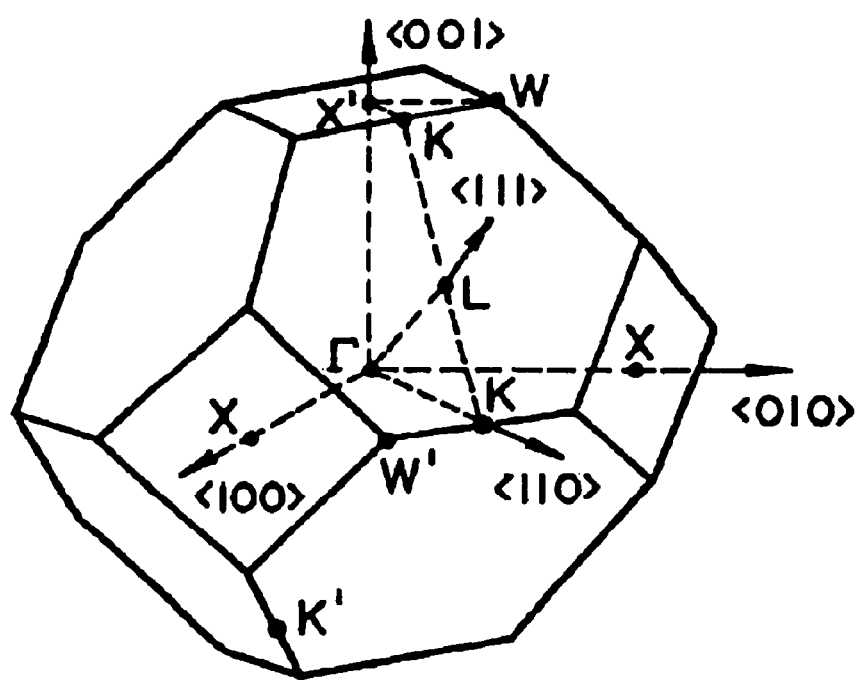
FIG. 29 is a view showing a Brillouin zone of the diamond structure.

The unit cell D1 of the diamond structure has a periodic refractive index distribution in each of a plurality of the surface directions defined by $\Gamma$-K-L-K-X' and $\Gamma$-L-W'-K' of the Brillouin zone shown in FIG. 29. The unit cell D1 of the diamond structure forms photonic bandgaps to a specific spectrum range in all directions, whereby light is confined.

Figure 26:
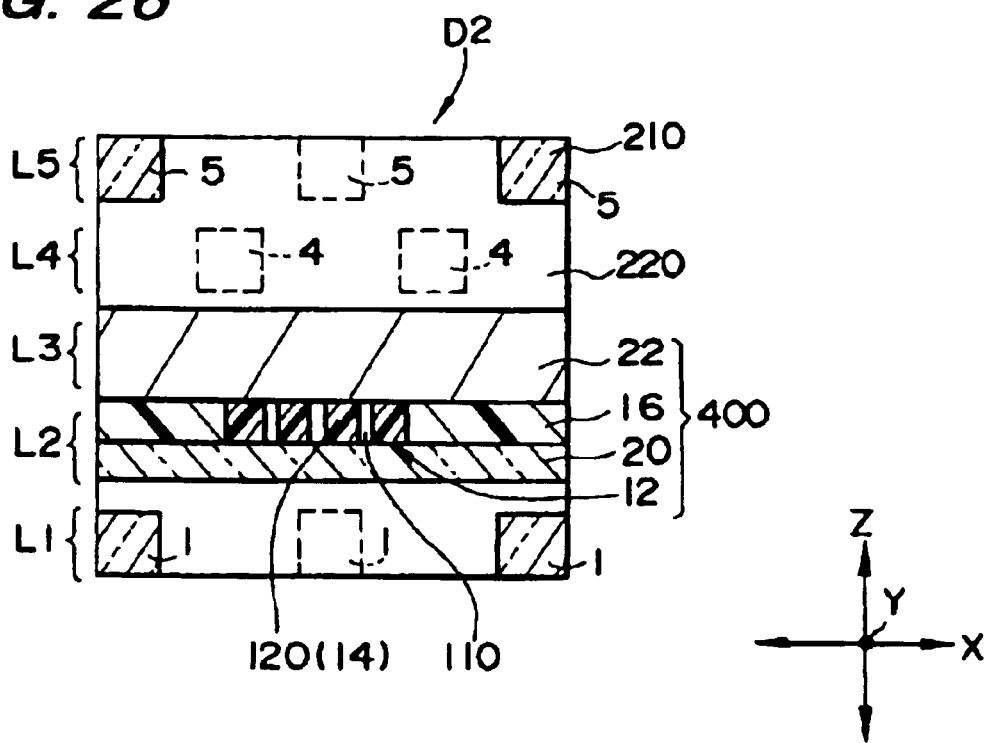
FIG. 26 is a view schematically showing a second unit cell of the diamond structure of an optical section of the light-emitting device shown in FIG. 24.

The second unit cell D2 of the diamond structure includes the laminated section 400 formed in part of the grating, specifically, at the levels L2 and L3, as shown in FIG. 26. FIG. 26 shows the second unit cell D2 of the diamond structure at the center.

The first optical section 12 makes up part of the diamond structure which forms three-dimensional photonic bandgaps to a specific spectrum range according to the shape (size) and the medium combination.

More specifically, the first medium layers 120 and the second medium layers 110 having different refractive indices are alternately arranged in the first optical section 12, as shown in FIG. 26. In the present embodiment, the first medium layers 120 are formed using the material for the light-emitting layer 14 and also functions as the light-emitting layer 14. The second medium layers 110 are formed using the material for the insulation layer 16.

The first optical section 12 has a defect section (not shown) in the same manner as in the first to third embodiments. The defect section is formed so that the energy level caused by the defect is within the emission spectrum from the light-emitting layer 14 by electrical pumping.

In the directions other than the light-emitting direction (X direction in this example), the laminated section 400 formed of the anode 20, first optical section 12, insulation layer 16, and cathode 22 is set so as not to function as a defect for the second unit cell D2 of the diamond structure. Other second unit cells D2 of the diamond structure are formed in this manner.

The materials for the first medium layers 210 and the second medium layers 220 which make up the unit cells D1 and D2 of the diamond structure are not limited insofar as each of these layers can form photonic bandgaps by periodic distribution. The first and second insulation layers 13 and 17 may be formed using the material for forming the medium layer 220 which makes up the unit cells D1 and D2 of the diamond structure.

In the present embodiment, the first optical section 12 also functions as the light-emitting layer 14. The first optical section 12 is formed so that the energy level caused by the defect is within the emission spectrum from the organic light-emitting layer 14 by electrical pumping in one direction (X direction, for example). On the other hand, the photonic bandgaps of the first optical section 12 in directions other than the X direction and the photonic bandgaps of the Brillouin zone of the second optical section D100 in all directions are set so that each photonic band gap includes at least the emission spectrum from the organic light-emitting layer 14 by electrical pumping. Specifically, the photonic bandgaps are set so that light emitted in the first optical section 12 is not propagated in all directions other than the X direction in three dimensions. The second optical section D100 may be formed to the extent to substantially contribute to light confinement.

Sufficiency of the light confinement conditions in the optical section 300 can be controlled by the number of pairs of the optical sections, the difference in the refractive indices of the medium layers which form the optical section, and the like, appropriately by the number of pairs of optical sections.

Device Operation

The action and effect of the light-emitting device 4000 are described below.

Electrons and holes are injected into the light-emitting layer 14 (first optical section 12) respectively from the cathode 22 and the anode 20 by applying a specific voltage to the anode 20 and the cathode 22. Since the mechanism of light emission in the light-emitting section 14 and the mechanism of light propagation through the first optical section 12 and the waveguide section 200 are the same as in the first to third embodiments, the description thereof is omitted.

Spontaneous emission of the emitted light in three dimensions is inhibited by the three-dimensional photonic bandgaps formed by the second optical section D100 including the first optical section 12. As a result, since only light with a specific spectrum range is emitted, the emitted light has wavelength selectivity, a narrow emission spectrum width, and excellent directivity.

Effect

The major effects of the present embodiment are the same as those of the first embodiment. The present embodiment can further achieve the following effects.

(a) The second optical section D100 has a diamond structure and forms photonic bandgaps to a specific spectrum range in all directions. Therefore, light is confined more certainly in three dimensions in comparison with the first embodiment, thereby increasing efficiency.

(b) The first optical section 12 is formed in the opening 16a. The first medium layer 120 in the first optical section 12 forms part of the organic light-emitting layer 14. According to this configuration, the organic light-emitting layer 14 in which light is emitted and the first optical section 12 become the same region, whereby excellent current efficiency and emission efficiency can be achieved.

Modification Example of Optical Section

Figure 22:
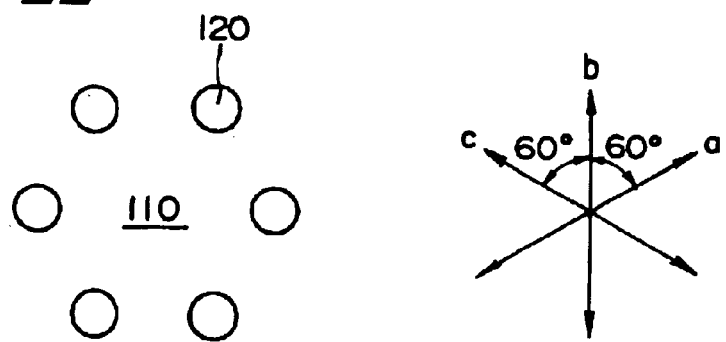
FIG. 22 is a view showing a modification example of the optical section.

In the above embodiments, structures shown in FIGS. 22 and 23 may be employed for the first optical section 12. In these figures, the same sections as those shown in FIG. 7 are represented by the same symbols. Detailed description of these sections is omitted.

(A) FIG. 22 shows an example in which the optical section is formed in the shape of a honeycomb lattice. In the case of this optical section, propagation of light is inhibited two-dimensionally in three directions (a, b, and c directions). In particular, in the case of the optical section in the shape of a honeycomb lattice shown in FIG. 22, light can be confined as any arbitrary polarized waves.

Figure 23A:
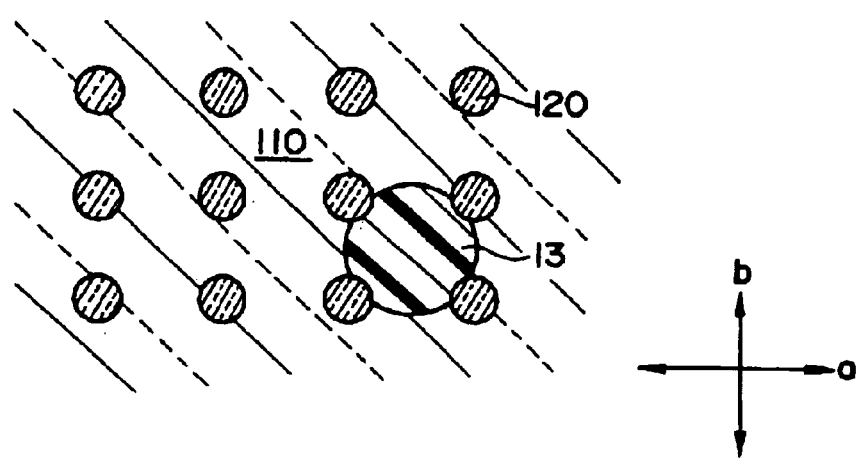
FIGS. 23A and 23B are views showing a further modification example of the optical section.
Figure 23B:
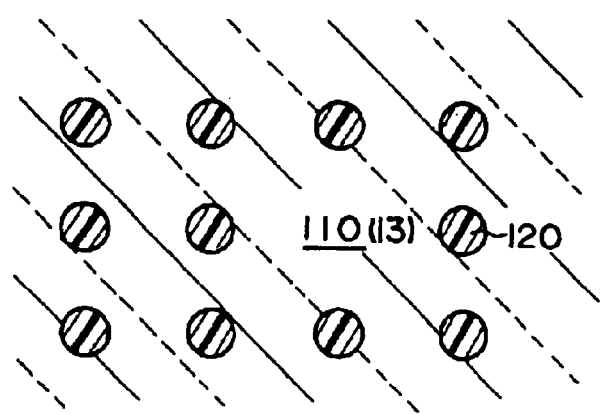

(B) FIGS. 23A and 23B show an example in which the optical section is formed in the shape of a tetragonal lattice. The optical section shown in A in this figure has a structure in which the defect section 13 is formed in part of the second medium layer 110. In the optical section shown in B in this figure, the defect section is formed by making part of the first medium layers 120 irregular without forming part of the first medium layers, for example.

In the case of such an optical section in the shape of tetragonal lattice, propagation of light is inhibited two-dimensionally in two directions (a and b directions).

What is claimed is:

1. A light-emitting device, comprising:
   a substrate;
   a light-emitting device section, formed on the substrate, and including,
   a light-emitting layer emitting light by electroluminescence,
   a pair of electrode layers for applying an electric field to the light-emitting layer,
   an optical section for propagating light emitted in the light-emitting layer in a specific direction, and
   an insulation layer disposed between the pair of electrode layers, having an opening formed in part of the insulation layer and functioning as a current concentrating layer for specifying a region through which current supplied to the light-emitting layer flows through a layer in the opening,
   wherein the optical section forms photonic bandgaps inhibiting three dimensional spontaneous emission of light and includes a defect section which is set so that an energy level caused by a defect is within a specific emission spectrum, and
   wherein the light emitted in the light-emitting layer is emitted with spontaneous emission being inhibited in three dimensions by the photonic bandgaps.

2. The light-emitting device according to claim 1, further comprising a waveguide section integrally formed with the light-emitting device section,
   wherein the waveguide section includes:
      a core layer which is optically continuous with at least part of the optical section; and
      a cladding layer which is optically continuous with the insulation layer.

3. A light-emitting device, comprising:
   a substrate;
   a light-emitting device section formed on the substrate, and including
   a light-emitting layer emitting light by electroluminescence,
   a pair of electrode layers for applying an electric field to the light-emitting layer,
   an optical section for propagating light emitted in the light-emitting layer in a specific direction, and
   an insulation layer disposed between the pair of electrode layers and functioning as a cladding layer; and
   waveguide section, that propagates light from the light-emitting device section and formed on the substrate, including
   a core layer continuously formed with part of the optical section, and
   a cladding layer continuously formed with the insulation layer, and
   wherein the optical section forms photonic bandgaps inhibiting three dimensional spontaneous emission of light and includes a defect section which is set so that an energy level caused by a defect is within a specific emission spectrum, and
   wherein the light emitted in the light-emitting layer is emitted with spontaneous emission being inhibited in three dimensions by the photonic bandgaps.

4. The light-emitting device according to claim 1, wherein the optical section comprises:
   a first optical section having a periodic refractive index distribution in at least two directions on XY surface and forming two-dimensional photonic bandgaps; and
   a second optical section having a periodic refractive index distribution in at least Z direction and forming at least one-dimensional photonic bandgaps, and
   wherein the defect section is formed in the first optical section, and light is emitted in one direction on the XY surface of the first optical section.

5. The light-emitting device according to claim 4,
   wherein the second optical section has a periodic refractive index distribution in the Z direction and forms one-dimensional photonic bandgaps.

6. The light-emitting device according to claim 4,
   wherein the second optical section has a periodic refractive index distribution in X, Y, and Z directions and forms three-dimensional photonic bandgaps.

7. The light-emitting device according to claim 4,
   wherein the second optical section comprises a plurality of unit cells of a diamond structure and forms three-dimensional photonic bandgaps.

8. The light-emitting device according to claim 4,
   wherein part of the second optical section is formed by a laminated portion including the first optical section, the pair of electrode layers and the insulation layer.

9. The light-emitting device according to claim 4,
   wherein the first optical section forms two-dimensional photonic bandgaps having a periodic refractive index distribution in the X and Y directions, and a structure which forms the two-dimensional photonic bandgaps includes columnar-shaped first medium layers arranged in a shape of a tetragonal lattice and second medium layers formed between the first medium layers.

10. The light-emitting device according to claim 4,
    wherein the first optical section forms two-dimensional photonic bandgaps having a periodic refractive index distribution in first, second, and third directions at the XY surface, and a structure which forms the two-dimensional photonic bandgaps includes columnar-shaped first medium layers and second medium layers formed between the first medium layers.

11. The light-emitting device according to claim 10,
    wherein the first medium layers are arranged in a shape of a triangular lattice.

12. The light-emitting device according to claim 10,
    wherein the first medium layers are arranged in a shape of a honeycomb lattice.

13. The light-emitting device according to claim 1,
    wherein at least part of the light-emitting layer is formed in the opening formed in the insulation layer.

14. The light-emitting device according to claim 4,
    wherein the insulation layer has the opening which is formed to face the first optical section and has a slit-shape extending in a periodic direction of the first optical section.

15. The light-emitting device according to claim 4,
    wherein the first optical section is formed in the opening.

16. The light-emitting device according to claim 15,
    wherein one medium layer of the first optical section forms part of the light-emitting layer.

17. The light-emitting device according to claim 3,
wherein the optical section comprises:
a first optical section having a periodic refractiveindex distribution in at least two directions on XY surface and forming two-dimensional photonic bandgaps; and
a second optical section having a periodic refractive index distribution in at least Z direction and forming at least one-dimensional photonic bandgaps, and
wherein the defect section is formed in the first optical section, and light is emitted in one direction on the XY surface of the first optical section.

18. The light-emitting device according to claim 17,
wherein the second optical section has a periodic refractive index distribution in the Z direction and forms one-dimensional photonic bandgaps.

19. The light-emitting device according to claim 17,
wherein the second optical section has a periodic refractive index distribution in X, Y, and Z directions and forms three-dimensional photonic bandgaps.

20. The light-emitting device according to claim 17,
wherein the second optical section comprises a plurality of unit cells of a diamond structure and forms three-dimensional photonic bandgaps.

21. The light-emitting device according to claim 17,
wherein part of the second optical section is formed by a laminated portion including the first optical section, the pair of electrode layers and the insulation layer.

22. The light-emitting device according to claim 17,
wherein the first optical section forms two-dimensional photomc bandgaps having a periodic refractive index distribution in the X and Y directions, and a structure which forms the two-dimensional photonic bandgaps includes columnar-shaped first medium layers arranged in a shape of a tetragonal lattice and second medium layers formed between the first medium layers.

23. The light-emitting device according to claim 17,
wherein the first optical section forms two-dimensional photonic bandgaps having a periodic refractive index distribution in first, second, and third directions at the XY surface, and a structure which forms the two-dimensional photonic bandgaps includes columnar-shaped first medium layers and second medium layers formed between the first medium layers.

24. The light-emitting device according to claim 23,
wherein the first medium layers are arranged in a shape of a triangular lattice.

25. The light-emitting device according to claim 23,
wherein the first medium layers are arranged in a shape of a honeycomb lattice.

26. The light-emitting device according to claim 3,
wherein at least part of the light-emitting layer is formed in the opening formed in the insulation layer.

27. The light-emitting device according to claim 17,
wherein the insulation layer has the opening which is formed to face the first optical section and has a slit-shape extending in a periodic direction of the first optical section.

28. The light-emitting device according to claim 17,
wherein the first optical section is formed in the opening.

29. The light-emitting device according to claim 28,
wherein one medium layer of the first optical section forms part of the light-emitting layer.

30. The light-emitting device according to claim 17,
wherein the core layer is continuously formed with at least a region in which the first optical section is formed.

31. The light-emitting device according to claim 1,
wherein at least the light-emitting device section is covered with a protective layer.

32. The light-emitting device according to claim 1,
wherein the light-emitting layer comprises an organic light-emitting material as a light-emitting material.

33. The light-emitting device according to claim 3,
wherein at least the light-emitting device section is covered with a protective layer.

34. The light-emitting device according to claim 3,
wherein the light-emitting layer comprises an organic light-emitting material as a light-emitting material.

* * * * *

UNITED STATES PATENT AND TRADEMARK OFFICE
CERTIFICATE OF CORRECTION

PATENT NO. : 6,795,463 B2
DATED : September 21, 2004
INVENTOR(S) : Tomoko Koyama et al.

It is certified that error appears in the above-identified patent and that said Letters Patent is hereby corrected as shown below:

Title page,
Item [*] Notice, "Subject to any disclaimer, the term of this patent is extended or adjusted under 35 U.S.C. 154(b) by 493 days." should read
-- Subject to any disclaimer, the term of this patent is extended or adjusted under 35 U.S.C. 154(b) by 493 days.

This patent is subject to a terminal disclaimer. --.

Signed and Sealed this

Eighth Day of November, 2005

JON W. DUDAS
*Director of the United States Patent and Trademark Office*